(12) United States Patent
Nishizawa et al.

(10) Patent No.: US 11,555,702 B2
(45) Date of Patent: Jan. 17, 2023

(54) PHYSICAL QUANTITY DETECTION DEVICE, MANUFACTURING METHOD FOR PHYSICAL QUANTITY DETECTION DEVICE, ELECTRONIC APPARATUS, AND MOVING OBJECT

(71) Applicant: SEIKO EPSON CORPORATION, Tokyo (JP)

(72) Inventors: Ryuta Nishizawa, Matsumoto (JP); Keiichi Yamaguchi, Ina (JP); Keiji Nakagawa, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 472 days.

(21) Appl. No.: 16/744,328

(22) Filed: Jan. 16, 2020

(65) Prior Publication Data

US 2020/0149889 A1     May 14, 2020

Related U.S. Application Data

(62) Division of application No. 15/244,294, filed on Aug. 23, 2016, now abandoned.

(30) Foreign Application Priority Data

Aug. 26, 2015 (JP) ................................. 2015-166480
Jun. 14, 2016 (JP) ................................. 2016-117700

(51) Int. Cl.
    *G01C 19/5621*     (2012.01)
    *B81C 1/00*     (2006.01)

(52) U.S. Cl.
    CPC ...... *G01C 19/5621* (2013.01); *B81C 1/00698* (2013.01); *B81C 2201/00* (2013.01)

(58) Field of Classification Search
    CPC ............ G01C 19/5621; B81C 1/00698; B81C 2201/00

(Continued)

(56) References Cited

U.S. PATENT DOCUMENTS 4,930,351 A    6/1990   Macy et al.
5,053,366 A    10/1991   Schoennahl (Continued)

FOREIGN PATENT DOCUMENTS

CN     104422789 A     3/2015
JP     H03-276013 A     12/1991

(Continued)

OTHER PUBLICATIONS

Feb. 4, 2019 Office Action issued in U.S. Appl. No. 15/244,294.

(Continued)

*Primary Examiner* — John K Kim
(74) *Attorney, Agent, or Firm* — Oliff PLC

(57) ABSTRACT

A gyro vibrating element includes a drive signal pattern including a drive signal electrode to which a drive signal is applied and a drive signal wire connected to the drive signal electrode, a first detection signal pattern including a first detection electrode that outputs a first detection signal and a first detection signal wire connected to the first detection electrode, the first detection signal pattern being capacitively coupled to the drive signal pattern, and a second detection signal pattern including a second detection electrode that outputs a second detection signal opposite in phase to the first detection signal and a second detection signal wire connected to the second detection electrode, the second detection signal pattern being capacitively coupled to the drive signal pattern. Any one of the first detection signal (Continued)

pattern, the second detection signal pattern, and the drive signal pattern includes an adjustment pattern for adjusting an area of the signal pattern.

3 Claims, 20 Drawing Sheets

(58) Field of Classification Search
USPC .................................................... 29/592.1
See application file for complete search history.

(56) References Cited

U.S. PATENT DOCUMENTS

| | | | |
|---|---|---|---|
| 5,166,571 A | 11/1992 | Konno et al. | |
| 5,329,816 A | 7/1994 | Soderkvist et al. | |
| 5,585,562 A | 12/1996 | Kurata et al. | |
| 5,998,911 A | 12/1999 | Kikuchi et al. | |
| 6,125,701 A * | 10/2000 | Sugitani | G01C 19/5607 |
| | | | 73/504.16 |
| 6,194,817 B1 | 2/2001 | Yachi et al. | |
| 6,389,897 B1 | 5/2002 | Tani et al. | |
| 9,347,776 B2 | 5/2016 | Nishizawa et al. | |
| 2005/0011267 A1 | 1/2005 | Kikuchi | |
| 2006/0107739 A1 | 5/2006 | Ogura | |
| 2011/0290023 A1 * | 12/2011 | Takagi | G01P 15/125 |
| | | | 73/514.16 |
| 2013/0127301 A1 * | 5/2013 | Osawa | H01L 41/09 |
| | | | 310/366 |
| 2013/0192367 A1 | 8/2013 | Osawa et al. | |
| 2013/0221804 A1 * | 8/2013 | Ichikawa | H01L 41/1132 |
| | | | 310/323.21 |
| 2013/0283910 A1 | 10/2013 | Nishizawa et al. | |
| 2013/0291638 A1 | 11/2013 | Nishizawa et al. | |
| 2013/0320812 A1 | 12/2013 | Yamaguchi et al. | |
| 2014/0020503 A1 | 1/2014 | Yamaguchi et al. | |
| 2014/0290362 A1 | 10/2014 | Nakagawa et al. | |
| 2015/0070031 A1 | 3/2015 | Tanaka | |
| 2015/0162522 A1 | 6/2015 | Ogura et al. | |
| 2015/0268107 A1 | 9/2015 | Nishizawa et al. | |
| 2016/0155927 A1 | 6/2016 | Kabasawa et al. | |
| 2017/0059393 A1 * | 3/2017 | Nishizawa | B81C 1/00698 |
| 2018/0017386 A1 | 1/2018 | Mitani et al. | |
| 2020/0149889 A1 * | 5/2020 | Nishizawa | B81C 1/00698 |

FOREIGN PATENT DOCUMENTS

| | | | | |
|---|---|---|---|---|
| JP | 08-304075 A | | 11/1996 | |
| JP | 2003-057038 A | | 2/2003 | |
| JP | 2003-194544 A | | 7/2003 | |
| JP | 2005062160 A | * | 3/2005 | ............ G01C 19/56 |
| JP | 2009-222666 A | | 10/2009 | |
| JP | 2010-054405 A | | 3/2010 | |
| JP | 2010-256332 A | | 11/2010 | |
| JP | 2010256332 A | * | 11/2010 | |
| JP | 2012-079751 A | | 4/2012 | |

OTHER PUBLICATIONS

May 30, 2019 Office Action issued for U.S. Appl. No. 15/244,294.
Oct. 17, 2019 Office Action issued in U.S. Appl. No. 15/244,294.
Oct. 16, 2018 Office Action issued in U.S. Appl. No. 15/244,294.

* cited by examiner

PHYSICAL QUANTITY DETECTION DEVICE, MANUFACTURING METHOD FOR PHYSICAL QUANTITY DETECTION DEVICE, ELECTRONIC APPARATUS, AND MOVING OBJECT

BACKGROUND

1. Technical Field

The present invention relates to a physical quantity detection device, a manufacturing method for the physical quantity detection device, and an electronic apparatus and a moving object including the physical quantity detection device.

2. Related Art

As a physical quantity detection device, there has been known a vibrating gyro vibrator in which a movable section that performs drive vibration and detection vibration and a base section to which the movable section is connected are integrally formed. Drive electrodes and detection electrodes are disposed on both the front and rear surfaces of the movable section and the base section. The vibrating gyro vibrator includes driving means for exciting the drive vibration and detecting means for detecting detection vibration. The movable section and the base section are formed of a material that transmits a laser beam. Electrodes for adjustment are disposed on both the front and rear surfaces of the movable section and the base section. The electrode for adjustment on the front surface and the electrode for adjustment on the rear surface are disposed not to be opposed to each other. All or a part of the electrodes for adjustment are removed by the laser beam (see, for example, JP-A-2009-222666 (Patent Literature 1).

Since all or a part of the electrodes for adjustment are removed by the laser beam, the vibrating gyro vibrator can perform balance adjustment of crosstalk to the detection electrodes of a drive signal involved in capacitance between wires.

In the vibrating gyro vibrator, in an implementation form, a difference among capacitances in a plurality of detection signal wires extending from the detection electrodes is known only when the capacitances are measured during manufacturing. Therefore, the electrodes for adjustment are provided in a plurality of comb tooth shapes according to the number of the detection signal wires.

Consequently, in the vibrating gyro vibrator, a further reduction in size is difficult because substantial spaces are necessary on both the front and rear surfaces of the movable section and the base section concerning the disposition of the comb tooth electrodes for adjustment.

In the vibrating gyro vibrator, among the comb teeth of the electrodes for adjustment, the comb teeth on which the laser beam is radiated are individually different according to the difference among the capacitances in the plurality of detection signal wires. Therefore, a laser beam radiation positions need to be changed every time.

It is likely that productivity of the vibrating gyro vibrator is deteriorated because the laser beam radiation positions are changed every time.

SUMMARY

An advantage of some aspects of the invention is to solve at least a part of the problems, and the invention can be implemented as the following forms or application examples.

Application Example 1

A physical quantity detection device according to this application includes: a drive signal pattern including a drive electrode to which a drive signal is applied and a drive signal wire connected to the drive electrode; a first detection signal pattern including a first detection electrode that outputs a first detection signal and a first detection signal wire connected to the first detection electrode, the first detection signal pattern being capacitively coupled to the drive signal pattern; and a second detection signal pattern including a second detection electrode that outputs a second detection signal opposite in phase to the first detection signal and a second detection signal wire connected to the second detection electrode, the second detection signal pattern being capacitively coupled to the drive signal pattern. Any one of the first detection signal pattern, the second detection signal pattern, and the drive signal pattern includes an adjustment pattern for adjusting an area of the signal pattern.

According to this application example, in the physical quantity detection device, any one of the first detection signal pattern capacitively coupled to the drive signal pattern, the second detection signal pattern capacitively coupled to the drive signal pattern, and the drive signal pattern includes the adjustment pattern for adjusting the area of the signal pattern.

Consequently, in the physical quantity detection device, the adjustment pattern is included in determined one signal pattern. Therefore, unlike the related art (e.g., Patent Literature 1), it is unnecessary to provide electrodes for adjustment in a plurality of comb tooth shapes according to the number of detection signal wires.

For example, by setting a sufficient difference between capacitances of the first detection signal pattern and the second detection signal pattern anticipating manufacturing variation in advance, it is possible to include the adjustment pattern in one of the first detection signal pattern and the second detection signal pattern.

As a result, in the physical quantity detection device, it is possible to reduce the difference between the capacitances of the first detection signal pattern and the second detection signal pattern using the adjustment pattern for adjusting the area of the signal pattern and achieve a further reduction in size and further improvement of productivity while improving detection accuracy.

Application Example 2

In the physical quantity detection device according to the application example, it is preferable that the adjustment pattern includes a first pattern portion having first width in a direction crossing an extending direction of the adjustment pattern and a second pattern portion having second width smaller than the first width in the direction.

According to this application example, since a narrow portion (the second pattern portion) having a small width dimension is provided in at least a part of the adjustment pattern, it is possible to adjust the capacitance of any one of the detection signal patterns in which the adjustment pattern is provided. Consequently, it is possible to reduce the difference between the capacitances of the first detection signal pattern and the second detection signal pattern and improve the detection accuracy.

Application Example 3

In the physical quantity detection device according to the application example, it is preferable that the physical quantity detection device includes a vibrating element including a base section and a vibrating section connected to the base section, the drive electrode, the first detection electrode, and the second detection electrode are disposed in the vibrating section, the drive signal wire, the first detection signal wire, and the second detection signal wire are disposed in the base section, and the adjustment pattern is disposed in the base section.

According to this application example, the physical quantity detection device includes the vibrating element including the base section and the vibrating section connected to the base section. The adjustment pattern is disposed in the base section. Therefore, it is possible to further reduce the influence on the vibrating section due to the adjustment of the area of the adjustment pattern than when, for example, the adjustment pattern is disposed in the vibrating section.

Application Example 4

In the physical quantity detection device according to the application example, it is preferable that the physical quantity detection device includes a vibrating element including a base section, a vibrating section connected to the base section, and a fixed section connected to the base section, the drive signal wire, the first detection signal wire, and the second detection signal wire are disposed in both of the base section and the fixed section, and the adjustment pattern is disposed in the fixed section.

According to this application example, in the physical quantity detection device, the vibrating element includes the fixed section connected to the base section. The adjustment pattern is disposed in the fixed section. Therefore, it is possible to further reduce the influence on the vibrating section due to the adjustment pattern.

In the physical quantity detection device, it is possible to further reduce the size of the base section than when the adjustment pattern is disposed in the base section.

Application Example 5

In the physical quantity detection device according to the application example, it is preferable that the physical quantity detection device includes a vibrating element, a relay board, and an electronic element electrically connected to the vibrating element by the relay board, the drive signal pattern, the first detection signal pattern, and the second detection signal pattern are disposed across the vibrating element and the relay board, and the adjustment pattern is disposed on the relay board.

According to this application example, the physical quantity detection device includes the vibrating element and the electronic element electrically connected to the vibrating element by the relay board. The adjustment pattern is disposed on the relay board. Therefore, it is possible to further reduce the sizes of the elements than when the adjustment pattern is disposed in the vibrating element or the electronic element.

Application Example 6

In the physical quantity detection device according to the application example, it is preferable that the physical quantity detection device includes a vibrating element and a container that houses the vibrating element, the vibrating element and the container are electrically connected to each other by a connecting section, the drive signal pattern, the first detection signal pattern, and the second detection signal pattern are disposed across the vibrating element and the container via the connecting section, and the adjustment pattern is disposed in the container.

According to this application example, the physical quantity device includes the vibrating element and the container. The vibrating element and the container are electrically connected to each other by the connecting section. The adjustment pattern is disposed in the container. Therefore, it is possible to further reduce the size of the vibrating element than when the adjustment pattern is disposed in the vibrating element.

Application Example 7

In the physical quantity detection device according to the application example, it is preferable that the adjustment pattern and the signal pattern to be capacitively coupled among the drive signal pattern, the first detection signal pattern, and the second detection signal pattern are disposed to be opposed to each other, and a constant potential pattern is disposed between the adjustment pattern and the signal pattern.

According to this application example, in the physical quantity detection device, the constant potential pattern is disposed between the adjustment pattern and the signal pattern to be capacitively coupled. Therefore, it is possible to further reduce the capacitance between the adjustment pattern and the signal pattern involved in the capacitive coupling than when the constant potential pattern is not disposed.

Application Example 8

In the physical quantity detection device according to the application example, it is preferable that the adjustment pattern and the signal pattern to be capacitively coupled among the drive signal pattern, the first detection signal pattern, and the second detection signal pattern are disposed to be opposed to each other, and a region not electrostatically shielded is present between the adjustment pattern and the signal pattern.

According to this application example, the region not electrostatically shielded is present between the adjustment pattern and the signal pattern to be capacitively coupled. Therefore, by adjusting the area of the adjustment pattern, even if an adjustment amount is the same, it is possible to further increase a change in capacitance than when the constant potential pattern is disposed.

Application Example 9

In the physical quantity detection device according to the application example, it is preferable that the adjustment pattern and the signal pattern to be capacitively coupled among the drive signal pattern, the first detection signal pattern, and the second detection signal pattern are disposed to be opposed to each other, and a region where a constant potential pattern is disposed and a region not electrostatically shielded are present between the adjustment pattern and the signal pattern.

According to this application example, in the physical quantity detection device, the region where the constant potential pattern is disposed and the region not electrostatically shielded are present between the adjustment pattern and the signal pattern to be capacitively coupled. Therefore, it is possible to increase or decrease the change in the capacitance according to a place where the area of the adjustment pattern is adjusted.

Application Example 10

An electronic apparatus according to this application example includes the physical quantity detection device according to any one of the application examples.

According to this application example, the electronic apparatus includes the physical quantity detection device according to any one of the application examples. Therefore, the effects described in any one of the application examples are achieved. It is possible to exhibit excellent performance.

Application Example 11

A moving object according to this application example includes the physical quantity detection device according to any one of the application examples.

According to this application example, the moving object includes the physical quantity detection device according to any one of the application examples. Therefore, the effects described in any one of the application examples are achieved. It is possible to exhibit excellent performance.

Application Example 12

A manufacturing method for a physical quantity detection device according to this application example includes: a drive signal pattern including a drive electrode to which a drive signal is applied and a drive signal wire connected to the drive electrode; a first detection signal pattern including a first detection electrode that outputs a first detection signal and a first detection signal wire connected to the first detection electrode, the first detection signal pattern being capacitively coupled to the drive signal pattern; and a second detection signal pattern including a second detection electrode that outputs a second detection signal opposite in phase to the first detection signal and a second detection signal wire connected to the second detection electrode, the second detection signal pattern being capacitively coupled to the drive signal pattern. Any one of the first detection signal pattern, the second detection signal pattern, and the drive signal pattern includes an adjustment pattern for adjustment. The manufacturing method for the physical quantity device includes reducing, by changing an area of the adjustment pattern, a difference between capacitance due to the capacitive coupling between the first detection signal pattern and the drive signal pattern and capacitance due to the capacitive coupling between the second detection signal pattern and the drive signal pattern.

According to this application example, in the manufacturing method for the physical quantity detection device, the difference between the capacitance between the first detection signal pattern and the drive signal pattern and the capacitance between the second detection signal pattern and the drive signal pattern is reduced by changing the area of the adjustment pattern. Therefore, it is possible to improve detection accuracy of the physical quantity detection device.

In the manufacturing method for the physical quantity detection device, the adjustment pattern is provided in any one of the first detection signal pattern, the second detection signal pattern, and the drive signal pattern. Therefore, it is possible to achieve a further reduction in the size and further improvement of productivity of the physical quantity detection device.

Application Example 13

In the manufacturing method for the physical quantity detection device according to the application example, it is preferable that the changing the area of the adjustment pattern includes preparing a physical quantity detection device in which the first detection signal pattern or the second detection signal pattern includes the adjustment pattern and the capacitance of the detection signal pattern including the adjustment pattern is larger than the capacitance of the other, removing at least a part of the adjustment pattern with an energy ray, and reducing the area of the adjustment pattern.

According to this application example, the manufacturing method for the physical quantity detection device includes the preparing the physical quantity detection device in which the capacitance of the detection signal pattern including the adjustment pattern is larger than the capacitance of the other, removing at least a part of the adjustment pattern with the energy ray, and reducing the area of the adjustment pattern. Therefore, it is possible to surely reduce a difference between the two capacitances.

Consequently, in the manufacturing method for the physical quantity detection device, it is possible to improve the detection accuracy of the physical quantity detection device.

Application Example 14

In the manufacturing method for the physical quantity detection device according to the application example, it is preferable that the changing the area of the adjustment pattern includes preparing a physical quantity detection device in which the first detection signal pattern or the second detection signal pattern includes the adjustment pattern and the capacitance of the detection signal pattern including the adjustment pattern is smaller than the capacitance of the other and increasing the area of the adjustment pattern with at least one of vapor deposition, sputtering, and an ion beam.

According to this application example, the manufacturing method for the physical quantity detection device includes the preparing the physical quantity detection device in which the capacitance of the detection signal pattern including the adjustment pattern is smaller than the capacitance of the other and increasing the area of the adjustment pattern with at least one of vapor deposition, sputtering, and an ion beam. Therefore, it is possible to surely reduce a difference between the two capacitances.

Consequently, in the manufacturing method for the physical quantity detection device, it is possible to improve the detection accuracy of the physical quantity detection device.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments embodying the invention are explained below with reference to the drawings.

First Embodiment

First, a gyro vibrating element serving as an example of a physical quantity detection device is explained.

Figure 1:
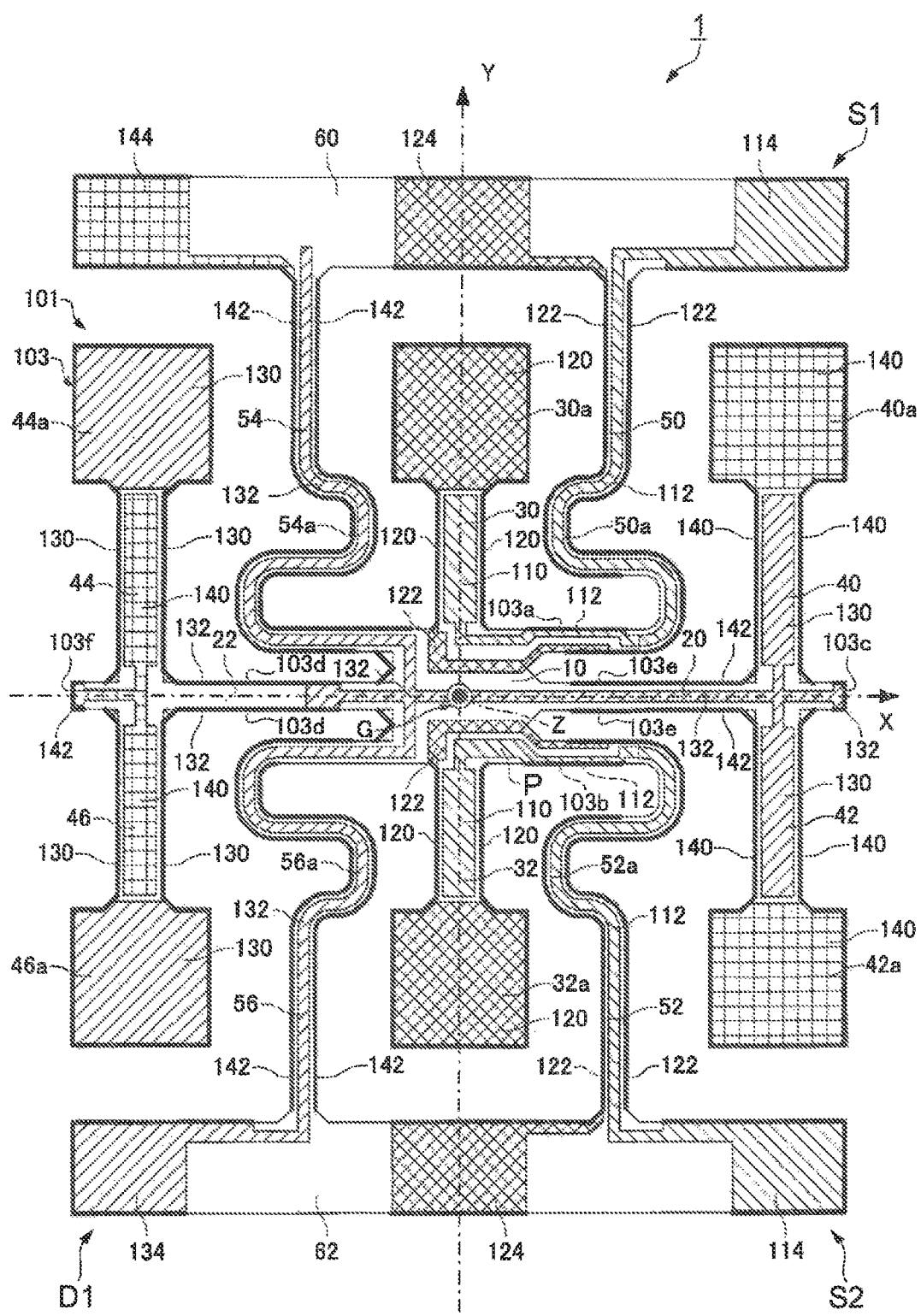
FIG. 1 is a plan view showing the configuration on one principal plane side of a gyro vibrating element in a first embodiment viewed from the one principal plane side.
Figure 2:
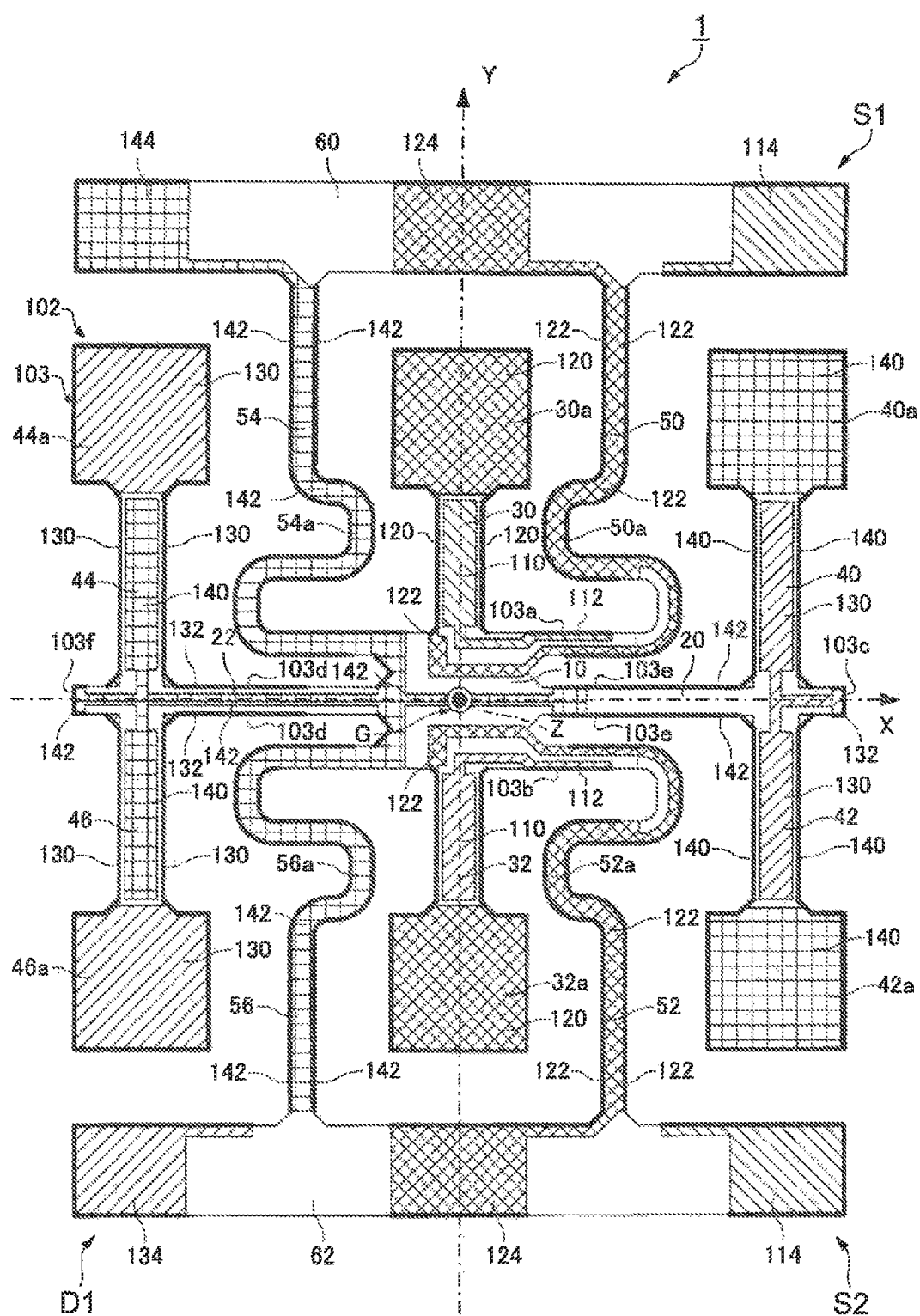
FIG. 2 is a plan view showing the configuration on the other principal plane side seen through from the one principal plane side of the gyro vibrating element in the first embodiment.
Figure 3A:
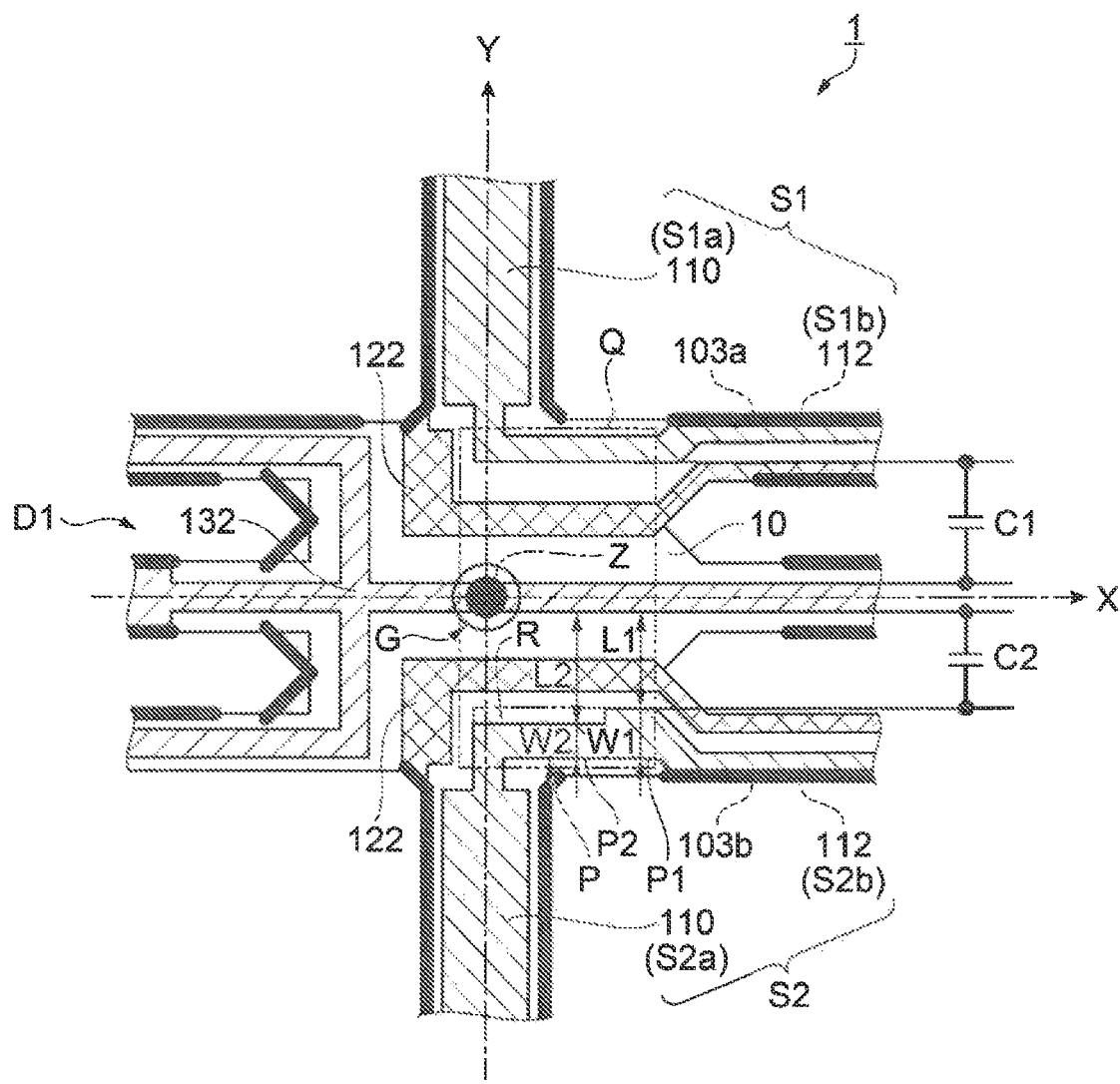
FIG. 3A is an enlarged view of the center of FIG. 1 for explaining an adjustment pattern.

FIG. 1 is a plan view showing the configuration on one principal plane side of a gyro vibrating element in a first embodiment viewed from the one principal plane side. FIG. 2 is a plan view showing the configuration on the other principal plane side seen through from the one principal plane side of the gyro vibrating element in the first embodiment. FIG. 3A is an enlarged view of the center of FIG. 1 for explaining an adjustment pattern. Note that in the figures and figures referred to below, for convenience of explanation, dimension ratios of components are different from actual dimension ratios.

Examples of the material of a gyro vibrating element 1 called double T type include piezoelectric materials such as quartz crystal, lithium tantalate, and lithium niobate.

As shown in FIGS. 1 and 2, for example, the gyro vibrating element 1 has spread on an XY plane and has thickness in a Z-axis direction according to crystal axes of quartz crystal. The gyro vibrating element 1 includes a first surface 101 (one principal plane; see FIG. 1) and a second surface 102 (the other principal plane; see FIG. 2) facing opposite directions each other and a side surface 103 that connects the first surface 101 and the second surface 102. The first surface 101 and the second surface 102 are surfaces parallel to the XY plane. The second surface 102 is a surface opposed to the inner side bottom surface of a container (not shown in the figure) in which the gyro vibrating element 1 is housed.

The side surface 103 is a surface orthogonal to the first surface 101 and the second surface 102 and parallel to a Z axis.

The gyro vibrating element 1 includes, as shown in FIGS. 1 and 2, a base section 10, first and second connecting arms 20 and 22, first and second detection vibration arms 30 an 32, first to fourth drive vibration arms 40, 42, 44, and 46, first to fourth beams 50, 52, 54, and 56, and first and second supporting sections 60 and 62.

The base section 10 has a center point G of the gyro vibrating element 1. The center point G is a center-of-gravity position of the gyro vibrating element 1. An X axis, a Y axis, and a Z axis are orthogonal to one another. The center point G is set as the origin. The gyro vibrating element 1 is desirably point symmetrical with respect to the center point G. That is, the gyro vibrating element 1 is desirably surface symmetrical with respect to an XZ plane and surface symmetrical with respect to a YZ plane.

The first and second connecting arms 20 and 22 respectively extend from the base section 10 in positive and negative directions along the X axis. The first and second detection vibration arms 30 and 32 respectively extend from the base section 10 in the positive and negative directions along the Y axis. The first and second drive vibration arms 40 and 42 respectively extend from the first connecting arm 20 in the positive and negative directions along the Y axis. The third and fourth drive vibration arms 44 and 46 respectively extend from the second connecting arm 22 in the positive and negative directions along the Y axis.

A detection vibration system that detects angular velocity is configured by the detection vibration arms 30 and 32. A drive vibration system that drives the gyro vibrating element 1 is configured by the connecting arms 20 and 22 and the drive vibration arms 40, 42, 44, and 46.

Distal end portions 30a and 32a of the detection vibration arms 30 and 32 desirably have a substantially square shape having width larger (length in the X-axis direction larger) than the widths of the other portions. Similarly, distal end portions 40a, 42a, 44a, and 46a of the drive vibration arms 40, 42, 44, and 46 desirably have a substantially square shape having width larger than the widths of the other portions. With the distal end portions 30a, 32a, 40a, 42a, 44a, and 46a having such a shape, the gyro vibrating element 1 can improve detection sensitivity of angular velocity serving as a physical quantity.

The first supporting section 60 functioning as the fixed section is disposed on the positive direction side of the Y axis with respect to the first detection vibration arm 30. The second supporting section 62 functioning as the fixed section is disposed on the negative direction side of the Y axis with respect to the second detection vibration arm 32.

The length in the X-axis direction of the supporting sections 60 and 62 is larger than the length in the X-axis direction of the distal end portions 30a and 32a of the detection vibration arms 30 and 32 and is, for example, substantially the same as a total of the lengths in the X-axis direction of the connecting arms 20 and 22 and the base section 10. In the example shown in the figures, the plane shape of the supporting sections 60 and 62 is a substantially rectangular shape but is not particularly limited. The supporting sections 60 and 62 are disposed apart from the detection vibration arms 30 and 32 and the drive vibration arms 40, 42, 44, and 46. The supporting sections 60 and 62 are fixed to the container or the like.

As shown in FIGS. 1 and 2, the first beam 50 extends from the base section 10 to the first supporting section 60 passing between the first detection vibration arm 30 and the first drive vibration arm 40. The second beam 52 extends from the base section 10 to the second supporting section 62 passing between the second detection vibration arm 32 and the second drive vibration arm 42. The third beam 54 extends from the base section 10 to the first supporting section 60 passing between the first detection vibration arm 30 and the third drive vibration arm 44. The fourth beam 56 extends from the base section 10 to the second supporting section 62 passing between the second detection vibration arm 32 and the fourth drive vibration arm 46.

In this way, the first and third beams 50 and 54 are connected the first supporting section 60. The second and fourth beams 52 and 56 are connected to the second supporting section 62 and supports the base section 10. The beams 50, 52, 54, and 56 desirably respectively include S-shaped sections 50a, 52a, 54a, and 56a.

In the example shown in the figures, the first beam 50 extends from the base section 10 in the positive direction of the X axis, subsequently, extends in the positive direction of the Y axis, extends in the negative direction of the X axis, extends in the positive direction of the Y axis, extends in the positive direction of the X axis, extends in the positive direction of the Y axis, and connected to the first supporting section 60. That is, in the example shown in the figures, the first beam 50 includes three portions parallel to the X-axis direction in the S-shaped section 50a.

Similarly, the respective second to fourth beams 52, 54, and 56 include three portions parallel to the X-axis direction in the S-shaped sections 52a, 54a, and 56a. With the S-shaped sections 50a, 52a, 54a, and 56a, the beams 50, 52, 54, and 56 can obtain elasticity in the X-axis direction and the Y-axis direction.

In the gyro vibrating element 1, as shown in FIGS. 1 and 2, detection signal electrodes 110, detection signal wires 112, detection signal terminals 114, detection ground electrodes 120, detection ground wires 122, detection ground terminals 124, drive signal electrodes 130, drive signal wires 132, drive signal terminals 134, drive ground electrodes 140, drive ground wires 142, and drive ground terminals 144 are formed.

For convenience, in FIGS. 1 and 2, the detection signal electrodes 110, the detection signal wires 112, the detection signal terminals 114 are indicated by right descending hatching, the detection ground electrodes 120, the detection ground wires 122, and the detection ground terminals 124 are indicated by cross hatching, the drive signal electrodes 130, the drive signal wires 132, and the drive signal terminals 134 are indicated by left descending hatching, and the drive ground electrodes 140, the drive ground wires 142, and the drive ground terminals 144 are indicated by cross longitudinal and lateral lines. In FIGS. 1 and 2, electrodes, wires, and terminals formed on the side surface 103 of the gyro vibrating element 1 are indicated by thick lines.

As the material of the electrodes 110, 120, 130, and 140, the wires 112, 122, 132, and 142, and the terminals 114, 124, 134, and 144, it is desirable to use, for example, a material obtained by stacking chrome and gold in order from the gyro vibrating element 1 side. The electrodes 110, 120, 130, and 140 are electrically separated from one another. The wires 112, 122, 132, and 142 are electrically separated from one another. The terminals 114, 124, 134, and 144 are electrically separated from one another.

The electrodes, the wires, and the terminals are explained in order below.

(1) The Detection Signal Electrodes, the Detection Signal Wires, and the Detection Signal Terminals As shown in FIGS. 1 and 2, the detection signal electrodes 110 are formed in the first and second detection vibration arms 30 and 32. However, in the example shown in the figures, the detection signal electrodes 110 are not formed at the distal end portions 30a and 32a of the first and second detection vibration arms 30 and 32. More specifically, the detection signal electrodes 110 are formed on the first surface 101 and the second surface 102 of the first and second detection vibration arms 30 and 32. The detection signal electrodes 110 are surfaces symmetrically disposed with respect to the XZ plane. The detection signal electrodes 110 are electrodes for detecting, when detection vibration of the first and second detection vibration arms 30 and 32 is excited, distortion of a piezoelectric material caused by the vibration.

As shown in FIG. 1, the detection signal wires 112 are formed on the first and second beams 50 and 52. More specifically, the detection signal wires 112 are formed on the first surfaces 101 of the first and second beams 50 and 52.

Further, as shown in FIGS. 1 and 2, the detection signal wires 112 are formed on a side surface 103a of a joining portion of the first beam 50 and the base section 10, a side surface 103b of a joining portion of the second beam 52 and the base section 10, and the first and second surfaces 101 and 102 of the base section 10.

The detection signal terminals 114 are formed in the first and second supporting sections 60 and 62. More specifically, the detection signal terminals 114 are formed on the first and second surfaces 101 and 102 and the side surfaces 103 of the first and second supporting sections 60 and 62. The detection signal terminals 114 formed on the surfaces 101 and 102 and the side surface 103 of the first supporting section 60 are electrically connected to one another. The detection signal terminals 114 formed on the surfaces 101 and 102 and the side surface 103 of the second supporting section 62 are electrically connected to one another.

In the example shown in the figures, the detection signal terminal 114 formed in the first supporting section 60 is disposed on the positive direction side of the Y axis with respect to the distal end portion 40a of the first drive vibration arm 40 where the drive ground electrode 140 is formed as explained below. That is, the detection signal terminal 114 formed in the first supporting section 60 and the drive ground electrode 140 formed at the distal end portion 40a are considered to be opposed to each other in the Y-axis direction.

The detection signal terminal 114 formed in the second supporting section 62 is disposed on the negative direction side of the Y axis with respect to the distal end portion 42a of the second drive vibration arm 42 where the drive ground electrode 140 is formed as explained below. That is, the detection signal terminal 114 formed in the second supporting section 62 and the drive ground electrode 140 formed at the distal end portion 42a are considered to be opposed to each other in the Y-axis direction.

As shown in FIG. 1, the detection signal terminal 114 formed in the first supporting section 60 is electrically connected to, via the detection signal wire 112 formed in the first beam 50, the detection signal electrode 110 formed in the first detection vibration arm 30.

More specifically, as shown in FIGS. 1 and 2, the detection signal terminal 114 formed in the first supporting section 60 is connected to the detection signal wire 112 formed on the first surface 101 of the first beam 50. The detection signal wire 112 is connected from the first surface 101 of the first beam 50 to the detection signal electrodes 110 formed on the first and second surfaces 101 and 102 of the first detection vibration arm 30 passing the surface 103a in the joining portion of the first beam 50 and the base section 10 and the first and second surfaces 101 and 102 of the base section 10. Consequently, a first detection signal generated when the first detection vibration arm 30 vibrates can be transmitted from the detection signal electrode 110 to the detection signal terminal 114 formed in the first supporting section 60.

As shown in FIGS. 1 and 3A, the detection signal terminal 114 formed in the first supporting section 60, the detection signal wire 112 (a first detection signal wire S1b) formed in the first beam 50, and the detection signal electrode 110 (a first detection electrode S1a) formed in the first detection vibration arm 30 are collectively represented as a first detection signal pattern S1.

As shown in FIG. 1, the detection signal terminal 114 formed in the second supporting section 62 is electrically connected to, via the detection signal wire 112 formed in the second beam 52, the detection signal electrode 110 formed in the second detection vibration arm 32.

More specifically, as shown in FIGS. 1 and 2, the detection signal terminal 114 formed in the second supporting section 62 is connected to the detection signal wire 112 formed on the first surface 101 of the second beam 52. The detection signal wire 112 is connected from the first surface 101 of the second beam 52 to the detection signal electrodes 110 formed on the first and second surfaces 101 and 102 of the second detection vibration arm 32 passing the side surface 103b of the joining portion of the second beam 52 and the base section 10 and the first and second surfaces 101 and 102 of the base section 10. Consequently, a second detection signal generated when the second detection vibration arm 32 vibrates can be transmitted from the detection signal electrode 110 to the detection signal terminal 114 formed in the second supporting section 62.

As shown in FIGS. 1 and 3A, the detection signal terminal 114 formed in the second supporting section 62, the detection signal wire 112 (a second detection signal wire S2b) formed in the second beam 52, and the detection signal electrode 110 (a second detection electrode S2a) formed in the second detection vibration arm 32 are collectively represented as a second detection signal pattern S2.

(2) The Detection Ground Electrodes, the Detection Ground Wires, and the Detection Ground Terminals As shown in FIGS. 1 and 2, the detection ground electrodes 120 are formed at the distal end portions 30a and 32a further on the distal end side than the detection signal electrodes 110 of the first and second detection vibration wires 30 and 32.

More specifically, the detection ground electrodes 120 are formed on the first and second surfaces 101 and 102 of the distal end portions 30a and 32a. Further, the detection ground electrodes 120 are formed on the side surfaces 103 of the first and second detection vibration arms 30 and 32. The detection ground electrodes 120 formed on the surfaces 101 and 102 and the side surface 103 of the first detection vibration arm 30 are electrically connected to one another. The detection ground electrodes 120 formed on the surfaces 101 and 102 and the side surface 103 of the second detection vibration arm 32 are electrically connected to one another. In the example shown in the figures, the detection ground electrodes 120 are disposed surface symmetrically with respect to the XZ plane. The detection ground electrodes 120 have potential, which is a ground with respect to the detection signal electrode 110.

The detection ground wires 122 are formed in the first and second beams 50 and 52. More specifically, the detection ground wires 122 are formed on the second surfaces 102 and the side surfaces 103 of the first and second beams 50 and 52. Further, the detection ground wires 122 are formed on the first and second surfaces 101 and 102 of the base section 10. In the example shown in the figures, the detection ground wires 122 are disposed surface symmetrically with respect to the XZ plane.

The detection ground terminals 124 are formed in the first and second supporting sections 60 and 62.

More specifically, the detection ground terminals 124 are formed on the first and second surfaces 101 and 102 and the side surfaces 103 of the first and second supporting sections 60 and 62. The detection ground terminals 124 formed on the surfaces 101 and 102 and the side surface 103 of the first supporting section 60 are electrically connected to one another. The detection ground terminals 124 formed on the surfaces 101 and 102 and the side surface 103 of the second supporting section 62 are electrically connected to one another.

In the example shown in the figures, the detection ground terminal 124 formed in the first supporting section 60 is disposed on the positive direction side of the Y axis with respect to the distal end portion 30a of the first detection vibration arm 30 where the detection ground electrode 120 is formed. That is, the detection ground terminal 124 formed in the first supporting section 60 and the detection ground electrode 120 formed at the distal end portion 30a are considered to be opposed to each other in the Y-axis direction.

The detection ground terminal 124 formed in the second supporting section 62 is disposed in the negative direction side of the Y axis with respect to the distal end portion 32a of the second detection vibration arm 32 where the detection ground electrode 120 is formed. That is, the detection ground terminal 124 formed in the second supporting section 62 and the detection ground electrode 120 formed at the distal end portion 32a are considered to be opposed to each other in the Y-axis direction. In the example shown in the figure, the detection ground terminals 124 are disposed surface symmetrically with respect to the XZ plane.

The detection ground terminal 124 formed in the first supporting section 60 is electrically connected to, via the detection ground wire 122 formed in the first beam 50, the detection ground electrode 120 formed in the first detection vibration arm 30.

More specifically, the detection ground terminal 124 formed in the first supporting section 60 is connected to the detection ground wires 122 formed on the second surface 102 and the side surface 103 of the first beam 50. The detection ground wires 122 are connected from the second surface 102 and the side surface 103 of the first beam 50 to the detection ground electrode 120 formed on the side surface 103 of the first detection vibration arm 30 passing the first and second surfaces 101 and 102 of the base section 10.

The detection ground terminal 124 formed in the second supporting section 62 is electrically connected to, via the detection ground wire 122 formed in the second beam 52, the detection ground electrode 120 formed in the second detection vibration arm 32. More specifically, the detection ground terminal 124 formed in the second supporting section 62 is connected to the detection ground wires 122 formed on the second surface 102 and the side surface 103 of the second beam 52. The detection ground wires 122 are connected from the second surface 102 and the side surface 103 of the second beam 52 to the detection ground electrode 120 formed on the side surface 103 of the second detection vibration arm 32 passing the first and second surfaces 101 and 102 of the base section 10.

The detection signal electrodes 110, the detection signal wires 112, the detection signal terminals 114, the detection ground electrodes 120, the detection ground wires 122, and the detection ground terminals 124 are disposed as explained above. Consequently, the detection vibration generated in the first detection vibration arm 30 appears as electric charge between the detection signal electrode 110 and the detection ground electrode 120 formed in the first detection vibration arm 30. The detection vibration can be extracted as the first detection signal from the detection signal terminal 114 and the detection ground terminal 124 formed in the first supporting section 60. The detection vibration generated in the second detection vibration arm 32 appears as electric charge between the detection signal electrode 110 and the detection ground electrode 120 formed in the second detection vibration arm 32. The detection vibration can be extracted as the second detection signal from the detection signal terminal 114 and the detection ground terminal 124 formed in the second supporting section 62.

(3) The Drive Signal Electrodes, the Drive Signal Wires, and the Drive Signal Terminals As shown in FIGS. 1 and 2, the drive signal electrodes 130 functioning as drive electrodes are formed in the first and second drive vibration arms 40 and 42. However, in the example shown in the figures, the drive signal electrodes 130 are not formed at the distal end portions 40a and 42a of the first and second drive vibration arms 40 and 42.

More specifically, the drive signal electrodes 130 are formed on the first surface 101 and the second surface 102 of the first and second drive vibration arms 40 and 42. Further, the drive signal electrodes 130 are formed on the side surfaces 103 of the third and fourth drive vibration arms 44 and 46 and the first and second surfaces 101 and 102 of the distal end portions 44a and 46a of the third and fourth drive vibration arms 44 and 46.

The drive signal electrodes 130 formed on the surfaces 101 and 102 and the side surface 103 of the third drive vibration arm 44 are electrically connected to one another. The drive signal electrodes 130 formed on the surfaces 101 and 102 and the side surface 103 of the fourth drive vibration arm 46 are electrically connected to one another. In the example shown in the figures, the drive signal electrodes 130 are disposed surface symmetrically with respect to the XZ plane. The drive signal electrodes 130 are electrodes for exciting drive vibration of the first to fourth drive vibration arms 40, 42, 44, and 46.

As shown in FIG. 1, the drive signal wires 132 are formed in the third and fourth beams 54 and 56. More specifically, the drive signal wires 132 are formed on the first surfaces 101 of the third and fourth beams 54 and 56. Further, the drive signal wires 132 are formed on the first surface 101 of the base section 10, the first surface 101 of the first connecting arm 20, a side surface 103c parallel to the YZ plane of the first connecting arm 20, and a side surface 103d parallel to the XZ plane of the second connecting arm 22. In the example shown in the figures, the drive signal wires 132 are disposed surface symmetrically with respect to the XZ plane.

As shown in FIGS. 1 and 2, the drive signal terminal 134 is formed in the second supporting section 62. More specifically, the drive signal terminals 134 are formed on the first and second surfaces 101 and 102 and the side surface 103 of the second supporting section 62. The drive signal terminals 134 formed on the surfaces 101 and 102 and the side surface 103 of the second supporting section 62 are electrically connected to one another. In the example shown in the figure, the drive signal terminal 134 formed in the second supporting section 62 is disposed on the negative direction side of the Y axis with respect to the distal end portion 46a of the fourth drive vibration arm 46 where the drive signal electrode 130 is formed. That is, the drive signal terminal 134 formed in the second supporting section 62 and the drive signal electrode 130 formed at the distal end portion 46a are considered to be opposed to each other in the Y-axis direction.

As shown in FIG. 1, the drive signal terminal 134 formed in the second supporting section 62 is electrically connected to the drive signal electrodes 130 formed in the first to fourth drive vibration arms 40, 42, 44, and 46 via the drive signal wire 132 formed in the fourth beam 56.

More specifically, the drive signal terminal 134 is connected to the drive signal wire 132 formed on the first surface 101 of the fourth beam 56. The drive signal wire 132 is connected from the first surface 101 of the fourth beam 56 to the drive signal electrodes 130 formed on the first surfaces 101 of the first and second drive vibration arms 40 and 42 passing through the first surfaced 101 of the base section 10 and the first surface 101 of the first connecting arm 20.

Further, as shown in FIGS. 1 and 2, the drive signal wire 132 is connected from the first surfaced 101 of the first connecting arm 20 to the drive signal electrodes 130 formed on the second surfaces 102 of the first and second drive vibration arms 40 and 42 passing the side surface 103c of the first connecting arm 20.

Further, the drive signal wire 132 is connected from the first surface 101 of the base section 10 to the drive signal electrodes 130 formed on the side surfaces 103 of the third and fourth drive vibration arms 44 and 46 passing the side surface 103d of the second connecting arm 22. Consequently, a drive signal for driving to vibrate the first to fourth drive vibration arms 40, 42, 44, and 46 can be transmitted from the drive signal terminal 134 to the drive signal electrodes 130.

The drive signal electrodes 130 functioning as the drive electrodes, the drive signal terminals 134, and the drive signal wires 132 are collectively represented as a drive signal pattern D1.

(4) The Drive Ground Electrodes, the Drive Ground Wires, and the Drive Ground Terminals As shown in FIGS. 1 and 2, the drive ground electrodes 140 are formed at the distal end portions 40a and 42a further on the distal end side than the drive signal electrodes 130 of the first and second drive vibration arms 40 and 42.

More specifically, the drive ground electrodes 140 are formed on the first and second surfaces 101 and 102 of the distal end portions 40a and 42a of the first and second drive vibration arms 40 and 42. Further, the drive ground electrodes 140 are formed on the side surfaces 103 of the first and second drive vibration arms 40 and 42. The drive ground electrodes 140 formed on the surfaces 101 and 102 and the side surface 103 of the first drive vibration arm 40 are electrically connected to one another. The drive ground electrodes 140 formed on the surfaces 101 and 102 and the side surface 103 of the second drive vibration arm 42 are electrically connected to one another.

Further, the drive ground electrodes 140 are formed on the first and second surfaces 101 and 102 of the third and fourth drive arms 44 and 46. However, in the example shown in the figures, the drive ground electrodes 140 are not formed at the distal end portions 44a and 46a. In the example shown in the figure, the drive ground electrodes 140 are disposed surface symmetrically with respect to the XZ plane. The drive ground electrodes 140 have potential, which is a ground with respect to the drive signal electrode 130.

The drive ground wires 142 are formed in the third and fourth beams 54 and 56. More specifically, the drive ground wires 142 are formed on the second surfaces 102 and the side surfaces 103 of the third and fourth beams 54 and 56. Further, the drive ground wires 142 are formed on the second surface 102 of the base section 10, a side surface 103e parallel to the XZ plane of the first connecting arm 20, the second surface 102 of the second connecting arm 22, and a side surface 103f parallel to the YZ plane of the second connecting arm 22. In the example shown in the figure, the drive ground wires 142 are disposed surface symmetrically with respect to the XZ plane.

The drive ground terminal 144 is formed in the first supporting section 60. More specifically, the drive ground terminals 144 are formed on the first and second surfaces 101 and 102 and the side surface 103 of the first supporting section 60. The drive ground terminals 144 formed on the surfaces 101 and 102 and the side surface 103 of the first supporting section 60 are electrically connected to one another.

In the example shown in the figure, the drive ground terminal 144 formed in the first supporting section 60 is disposed in the positive direction side of the Y axis with respect to the distal end portion 44a of the third drive vibration arm 44 where the drive signal electrode 130 is formed. That is, the drive ground terminal 144 formed in the first supporting section 60 and the drive signal electrode 130 formed at the distal end portion 44a are considered to be opposed to each other in the Y-axis direction.

The drive ground terminal 144 formed in the first supporting section 60 is electrically connected to, via the drive ground wire 142 formed in the third beam 54, the drive ground electrodes 140 formed in the first to fourth drive vibration arms 40, 42, 44, and 46.

More specifically, the drive ground terminal 144 is connected to the drive ground wires 142 formed on the second surface 102 and the side surface 103 of the third beam 54. The drive ground wires 142 are connected from the second surface 102 and the side surface 103 of the third beam 54 to the drive ground electrodes 140 formed on the side surfaces 103 of the first and second drive vibration arms 40 and 42 passing the second surface 102 of the base section 10 and the side surface 103e of the first connecting arm 20.

Further, the drive ground wires 142 are connected from the second surface 102 of the base section 10 to the drive ground electrodes 140 formed on the second surfaces 102 of the third and fourth drive vibration arms 44 and 46 passing the second surface 102 of the second connecting arm 22. Further, the drive ground wires 142 are connected from the second surface 102 of the second connecting arm 22 to the drive ground electrodes 140 formed on the first surfaces 101 of the third and fourth drive vibration arms 44 and 46 passing the side surface 103f of the second connecting arm 22.

The drive signal electrodes 130, the drive signal wires 132, the drive signal terminals 134, the drive ground electrodes 140, the drive ground wires 142, and the drive ground terminals 144 are disposed as explained above. Consequently, in the gyro vibrating element 1, by applying a drive signal between the drive signal terminal 134 formed in the second supporting section 62 and the drive ground terminal 144 formed in the first supporting section 60, it is possible to generate an electric field between the drive signal electrodes 130 and the drive ground electrodes 140 formed in the drive vibration arms 40, 42, 44, and 46 and drive to vibrate the drive vibration arms 40, 42, 44, and 46.

As explained above, the gyro vibrating element 1 includes the drive signal pattern D1 including the drive signal electrodes 130 to which the drive signal is applied, the drive signal wires 132 connected to the drive signal electrodes 130, and the drive signal terminals 134, the first detection signal pattern S1 including the first detection electrode S1a that outputs the first detection signal and the first detection signal wire S1b connected to the first detection electrode S1a, the first detection signal pattern S1 being capacitively coupled to the drive signal pattern D1 with capacitance C1 as shown in FIG. 3A, and the second signal pattern S2 including the second detection electrode S2a that outputs the second detection signal opposite in phase to the first detection signal and the second detection signal wire S2b connected to the second detection electrode S2a, the second detection signal pattern S2 being capacitively coupled to the drive signal pattern D1 with capacitance C2 as shown in FIG. 3A.

The gyro vibrating element 1 includes, in any one (the second detection signal pattern S2) of the first detection signal pattern S1, the second detection signal pattern S2, and the drive signal pattern D1, an adjustment pattern P for adjusting the area of the signal pattern (the second detection signal pattern S2).

As shown in FIG. 3A, the adjustment pattern P is disposed in a region where the first detection signal pattern S1 and the drive signal pattern D1 are arranged or the second detection signal pattern S2 and the drive signal pattern D1 are arranged, in this embodiment, an adjustment region Q where the first detection signal pattern S1, the second detection signal pattern S2, and the drive signal pattern D1 are arranged and capacitance adjustment can be performed. In the adjustment region Q, the adjustment pattern P in this embodiment is configured in a shape with an area increased by increasing a dimension in the width direction of a part of the second detection signal pattern S2. Specifically, the adjustment pattern P is provided with a width dimension, which is a dimension in a direction (the Y-axis direction in the figure) crossing the extending direction of the second detection signal pattern S2 (the X-axis direction in the figure), set as width W1.

A narrow section (a second pattern portion) P2 having width of a small width dimension (second width) W2 is formed by removing a part (a removed section R indicated by an alternate long and two short dashes line in the figure) on the drive signal pattern D1 side of the adjustment pattern P having the width W1 (first width). The adjustment pattern P having the width (the first width) W1 in a portion not removed is a wide section (a first pattern portion) P1. In other words, the adjustment pattern P includes the first pattern portion (the wide section P1) having the first width in a direction crossing an extending direction of the adjustment pattern P and the second pattern portion (the narrow section P2) having the second width smaller than the first width in the direction. A distance L1 between the adjustment pattern P (the first pattern portion) and the drive signal pattern D1 at the time of the width W1 (the first width) changes to a distance L2 between the adjustment pattern P (the second pattern portion) and the drive signal pattern D1 at the time of the width W2 (the second width) of the narrow section P2, whereby capacitance adjustment can be performed.

Figure 3B:
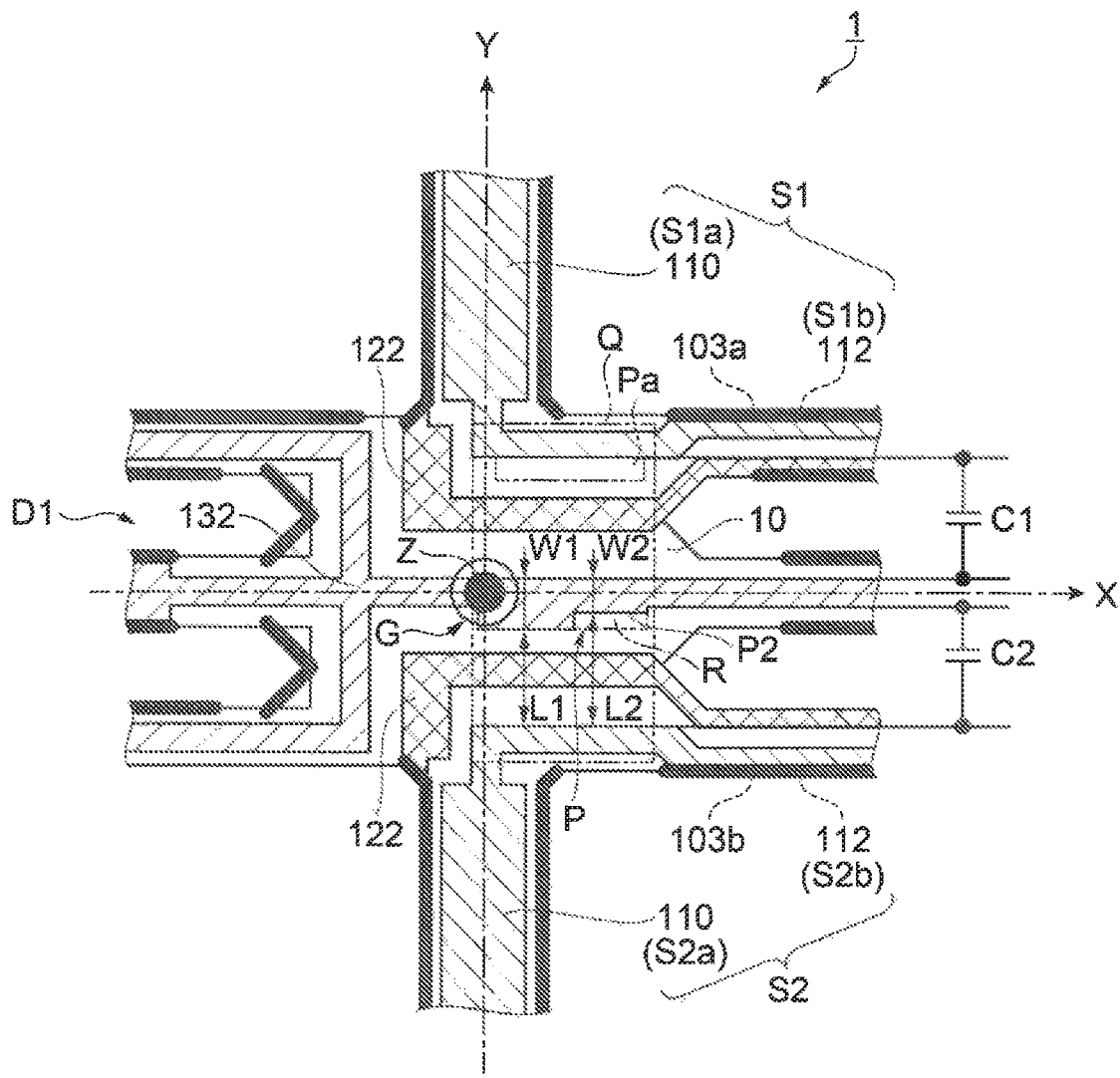
FIG. 3B is an enlarged view of the center of FIG. 1 for explaining anther disposition example 1 of the adjustment pattern.
Figure 3C:
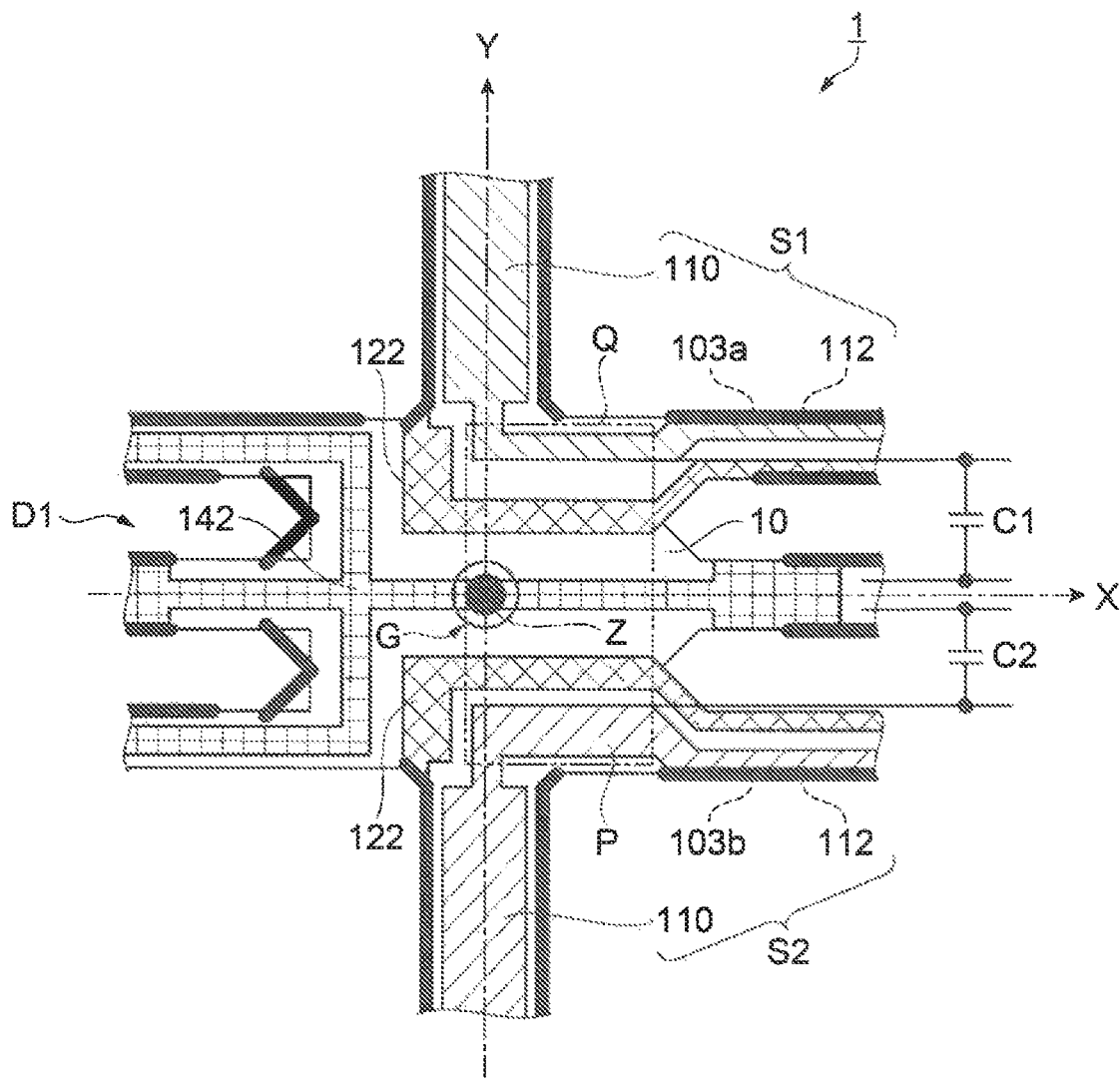
FIG. 3C is an enlarged view of the center of FIG. 2 for explaining another disposition example 2 of the adjustment pattern.
Figure 3D:
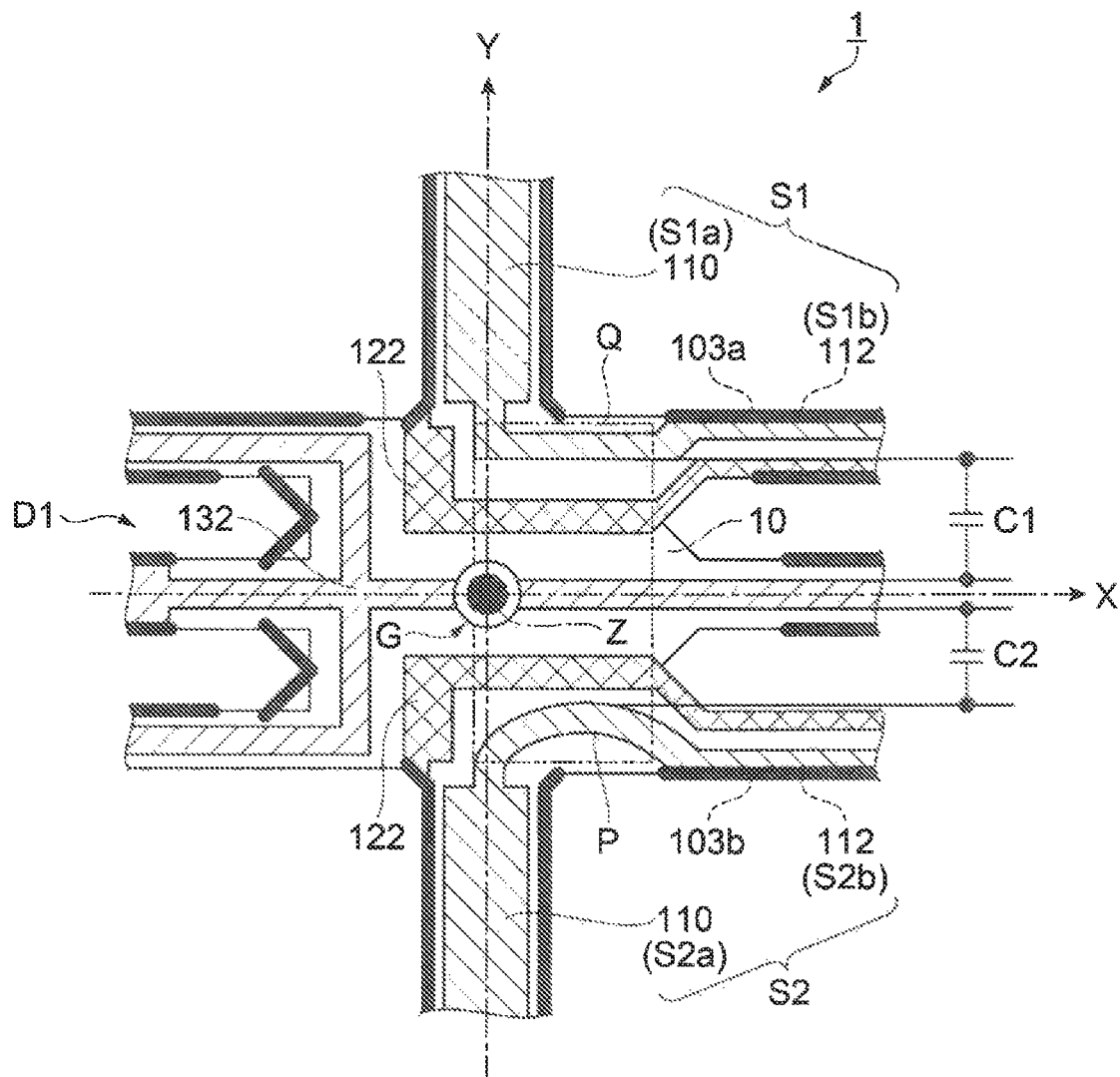
FIG. 3D is an enlarged view of the center of FIG. 1 for explaining another disposition example 3 of the adjustment pattern.

Note that the adjustment pattern P can be disposed in one of the drive signal pattern D1 and the first detection signal pattern S1. Another disposition example of the adjustment pattern P is explained with reference to FIGS. 3B, 3C, and 3D. FIG. 3B is an enlarged view of the center of FIG. 1 for explaining another disposition example 1 of the adjustment pattern. FIG. 3C is an enlarged view of the center of FIG. 2 for explaining another disposition example 2 of the adjustment pattern. FIG. 3D is an enlarged view of the center of FIG. 1 for explaining another disposition example 3 of the adjustment pattern.

As shown in FIG. 3B, in the adjustment region Q, the adjustment pattern P according to the other disposition example 1 is formed as the adjustment pattern P by increasing a dimension in the width direction of a part of the drive signal pattern D1. Specifically, the adjustment pattern P is provided with a width dimension, which is a dimension in a direction (the Y-axis direction in the figure) crossing an extending direction of the drive signal pattern D1 (the X-axis direction in the figure), set as the width W1. As explained above, the narrow section P2 having the width W2 of the small width dimension is formed by removing a part (the removed section R indicated by an alternate long and short two dashes line in the figure) on the second detection signal pattern S2 side of the adjustment pattern P having the width W1 provided in the drive signal pattern D1.

In the other disposition example 1 in which the adjustment pattern P is provided in the drive signal pattern D1, as in the embodiment, the distance L1 between the adjustment pattern P (the first pattern portion, which is the wide section) and the second detection signal pattern S2 at the time of the width W1 (the first width) changes to the distance L2 between the adjustment pattern P (the second pattern portion, which is the narrow section) and the second detection signal pattern S2 at the time of the width W2 (the second width), whereby capacitance adjustment can be performed.

Note that, as shown in FIG. 3B, the adjustment pattern P can be disposed in the first detection signal pattern S1. An adjustment pattern Pa disposed in the first detection signal pattern S1 can be provided in the adjustment region Q as a protrusion section (indicated by an alternate long and two short dashes line in the figure) obtained by increasing a dimension in the width direction of a part of the first detection signal pattern S1.

As shown in FIG. 3C, the adjustment pattern P according to another disposition example 2 can be disposed on the second surface 102 (the other principal plane; see FIG. 2) of the gyro vibrating element 1. On the second surface 102 side, as on the first surface 101 side, as shown in FIG. 3C, the adjustment pattern P can be disposed in a region where the first detection signal pattern S1 and the drive signal pattern D1 or the second detection signal pattern S2 and the drive signal pattern D1 are arranged, in this embodiment, the adjustment region Q where the first detection signal pattern S1, the second detection signal pattern S2, and the drive signal pattern D1 are arranged and capacitance adjustment can be performed. In the disposition example 2, in the adjustment region Q, the adjustment pattern P is formed as the adjustment pattern P by increasing a dimension in the width direction of a part of the second detection signal pattern S2.

Note that the patterns for adjustment P can be respectively disposed in the same patterns on both of the first surface 101 (one principal plane; see FIG. 1) and the second surface 102 (the other principal plane; see FIG. 2), for example, the second detection signal pattern S2 on the first surface 101 side and the second detection signal pattern S2 on the second surface 102 (the other principal plane; see FIG. 2) side. In this case, an adjustment region where capacitance adjustment can be performed increases. It is possible to increase a capacitance adjustment amount.

The adjustment pattern P according to another disposition example 3 shown in FIG. 3D is formed by bending a part of the second detection signal pattern S2 in an arcuate shape in the adjustment region Q. In the adjustment pattern P, the distance between the adjustment pattern P and the drive signal pattern D1 is changed by removing a top section on the drive signal pattern D1 side of the arcuate shape. Capacitance adjustment can be performed according to the change of the distance.

The gyro vibrating element 1 is a vibrating element including the base section 10 and the first and second detection vibration arms 30 and 32 and the first to fourth drive vibration arms 40, 42, 44, and 46 functioning as the vibrating sections connected to the base section 10. The drive signal electrodes 130, the first detection electrodes S1*a*, and the second detection electrodes S2*a* are disposed in the first and second detection vibration arms 30 and 32 and the first to fourth drive vibration arms 40, 42, 44, and 46. The drive signal wire 132, the first detection signal wire S1*b*, and the second detection signal wire S2*b* are disposed in the base section 10. The adjustment pattern P is disposed in the base section 10.

The operation of the gyro vibrating element 1 is explained.

Figure 4:
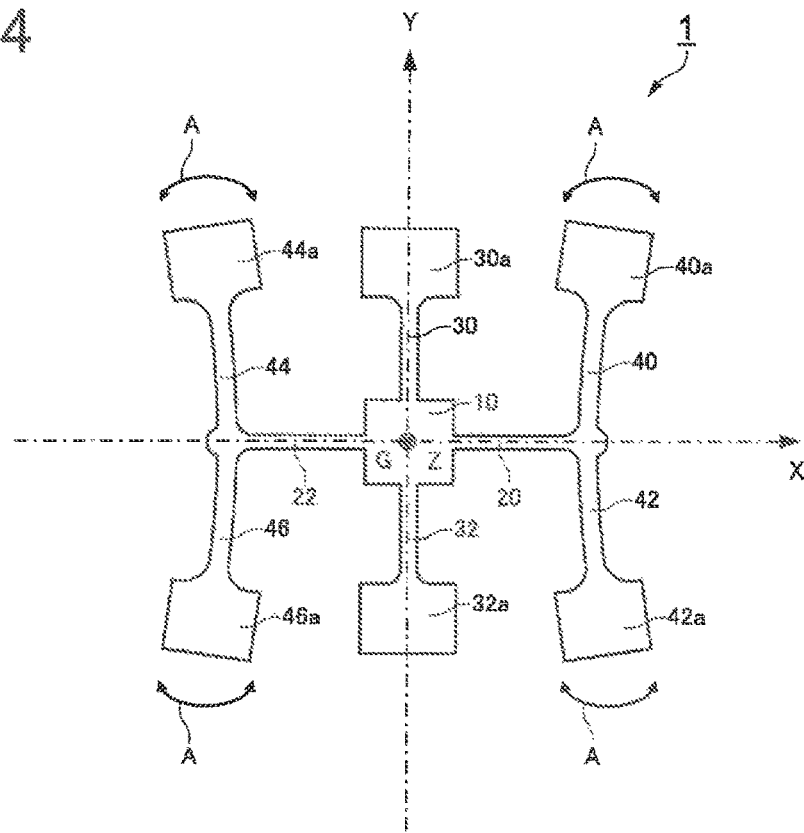
FIG. 4 is a schematic plan view for explaining the operation of the gyro vibrating element.
Figure 5:
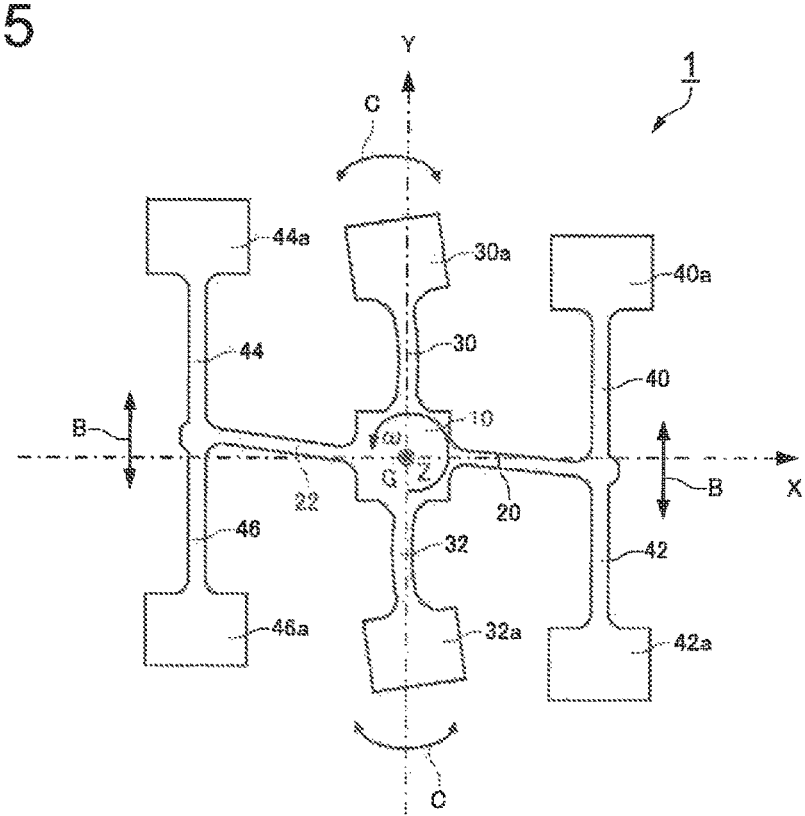
FIG. 5 is a schematic plan view for explaining the operation of the gyro vibrating element.

FIGS. 4 and 5 are schematic plan views for explaining the operation of the gyro vibrating element. Note that, in FIGS. 4 and 5, for convenience, components other than the base section 10, the first and second connecting arms 20 and 22, the first and second detection vibration arms 30 and 32, and the first to fourth drive vibration arms 40, 42, 44, and 46 are not shown in the figures.

As shown in FIG. 4, in the gyro vibrating element 1, when an electric field is generated between a drive signal electrode and a drive ground electrode in a state in which angular velocity is not applied, the first to fourth drive vibration arms 40, 42, 44, and 46 perform flexural vibration in a direction indicated by an arrow A. At this point, the first and second drive vibration arms 40 and 42 and the third and fourth drive vibration arms 44 and 46 perform vibrations surface symmetrical with respect to the YZ plane that passes the center point G (the center of gravity G) of the gyro vibrating element 1. Therefore, the base section 10, the first and second connecting arms 20 and 22, and the first and second detection vibration arms 30 and 32 hardly vibrate.

When angular velocity a around the Z axis is applied to the gyro vibrating element 1 in a state in which the drive vibration is performed, the gyro vibrating element 1 performs vibration shown in FIG. 5. That is, a Coriolis force in an arrow B direction acts on the first to fourth drive vibration arms 40, 42, 44, and 46 and the first and second connecting arms 20 and 22 configuring the drive vibration system. New vibration is excited. The vibration in the arrow B direction is vibration in the circumferential direction with respect to the center G. At the same time, in the first and second detection vibration arms 30 and 32, detection vibration in an arrow C direction is excited in response to the vibration in the arrow B direction. The detection signal electrodes and the detection ground electrodes formed in the first and second detection vibration arms 30 and 32 detect distortion of the piezoelectric material caused by the vibration. Angular velocity is calculated.

A circuit configuration related to driving and detection of the gyro vibrating element 1 is explained.

Figure 6:
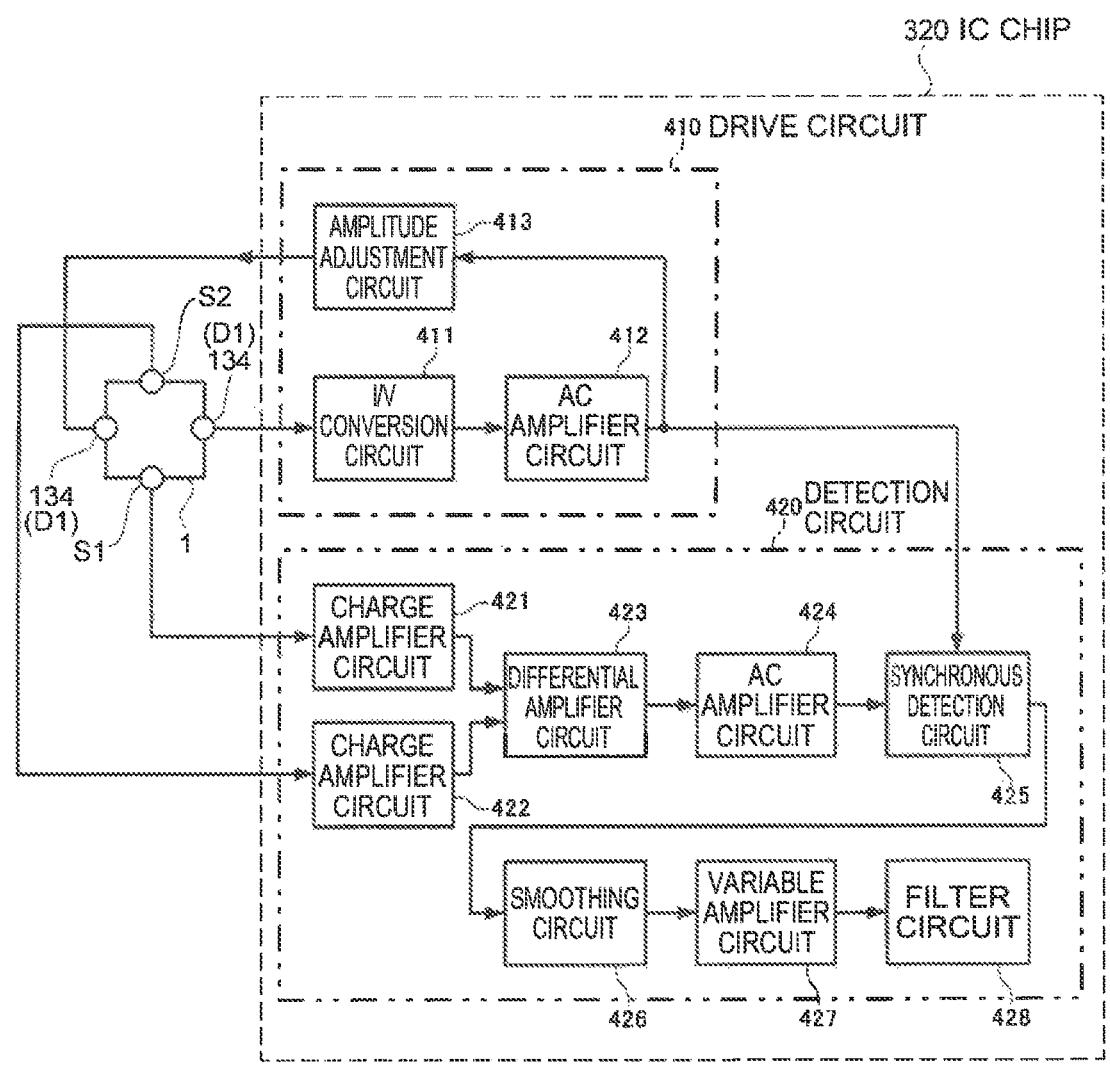
FIG. 6 is a schematic diagram showing a circuit configuration related to driving and detection of the gyro vibrating element.

FIG. 6 is a schematic diagram showing the circuit configuration related to the driving and the detection of the gyro vibrating element. Note that the following explanation of the circuit configuration is common to embodiments explained below.

As shown in FIG. 6, the circuit configuration related to the driving and the detection of the gyro vibrating element 1 includes a drive circuit 410 and a detection circuit 420. The drive circuit 410 and the detection circuit 420 are incorporated in an IC chip 320.

The drive circuit 410 includes an I/V conversion circuit (a current/voltage conversion circuit) 411, an AC amplifier circuit 412, and an amplitude adjustment circuit 413. The drive circuit 410 is a circuit that supplies a drive signal to the drive signal electrode 130 formed in the gyro vibrating element 1. The drive circuit 410 is explained in detail below.

When the gyro vibrating element 1 vibrates, an alternating current based on a piezoelectric effect is output from the drive signal electrode 130 formed in the gyro vibrating element 1 and input to the I/V conversion circuit 411 via the drive signal terminal 134. The I/V conversion circuit 411 converts the input alternating current into an AC voltage signal having a frequency same as a vibration frequency of the gyro vibrating element 1 and outputs the AC voltage signal.

The AC voltage signal output from the I/V conversion circuit 411 is input to the AC amplifier circuit 412. The AC amplifier circuit 412 amplifies and outputs the input AC voltage signal.

The AC voltage signal output from the AC amplifier circuit 412 is input to the amplitude adjustment circuit 413. The amplitude adjustment circuit 413 controls a gain to keep the amplitude of the input AC voltage signal at a fixed value and outputs the AC voltage signal subjected to the gain control to the drive signal electrode 130 via the drive signal terminal 134 formed in the gyro vibrating element 1. The gyro vibrating element 1 vibrates according to the AC voltage signal (a drive signal) input to the drive signal electrode 130.

The detection circuit 420 includes charge amplifier circuits 421 and 422, a differential amplifier circuit 423, an AC amplifier circuit 424, a synchronous detection circuit 425, a smoothing circuit 426, a variable amplifier circuit 427, and a filter circuit 428. The detection circuit 420 is a circuit that differentially amplifies a first detection signal generated in the detection signal electrode 110 (the first detection electrode S1*a*) formed in the first detection vibration arm 30 of the gyro vibrating element 1 and a second detection signal generated in the detection signal electrode 110 (the second detection electrode S2*a*) formed in the second detection vibration arm 32 of the gyro vibration element 1 to generate a differential amplified signal and detects a predetermined physical quantity (angular velocity) on the basis of the differential amplified signal. The detection circuit 420 is explained in detail below.

Detection signals (alternating currents) in opposite phases each other detected by the detection signal electrodes 110 (the first detection electrode S1*a* and the second detection electrode S2*a*) formed in the first and second detection vibration arms 30 and 32 of the gyro vibrating element 1 are input to the charge amplifier circuits 421 and 422 via the detection signal terminals 114 (in other words, the first and second detection signal patterns S1 and S2).

For example, the first detection signal detected by the detection signal electrode 110 (the first detection electrode S1*a*) formed in the first detection vibration arm 30 is input to the charge amplifier circuit 421. The second detection signal detected by the detection signal electrode 110 (the second detection electrode S2*a*) formed in the second detection vibration arm 32 is input to the charge amplifier circuit 422. The charge amplifier circuits 421 and 422 convert the input detection signals (the alternating currents) into AC voltage signals centering on a reference voltage Vref.

The differential amplifier circuit 423 differentially amplifies the output signal of the charge amplifier circuit 421 and the output signal of the charge amplifier circuit 422 to generate a differential amplified signal. An output signal (the differential amplified signal) of the differential amplifier circuit 423 is further amplified by the AC amplifier circuit 424.

The synchronous detection circuit 425 synchronously detects an output signal of the AC amplifier circuit 424 on the basis of the AC voltage signal output by the AC amplifier circuit 412 of the drive circuit 410 to thereby extract an angular velocity component.

A signal of the angular velocity component extracted by the synchronous detection circuit 425 is smoothed into a DC voltage signal by the smoothing circuit 426 and input to the variable amplifier circuit 427.

The variable amplifier circuit 427 amplifies (or attenuates) an output signal (the DC voltage signal) of the smoothing circuit 426 at a set amplification ratio (or an attenuation ratio) to change angular velocity sensitivity. A signal amplified (or attenuated) by the variable amplifier circuit 427 is input to the filter circuit 428.

The filter circuit 428 removes a high-frequency noise component from the output signal of the variable amplifier circuit 427 (accurately, attenuates the noise component to a predetermined level or less) and generates a detection signal having polarity and a voltage level corresponding to the direction and the magnitude of the angular velocity. The detection signal is output from an external output terminal (not shown in the figure) to the outside.

As explained above, in the gyro vibrating element 1 in the first embodiment, any one (the second detection signal pattern S2) of the first detection signal pattern S1 capacitively coupled to the drive signal pattern D1, the second detection signal pattern S2 capacitively coupled to the drive signal pattern D1, and the drive signal pattern D1 includes the adjustment pattern P for adjusting the area of the signal pattern (the second detection signal pattern S2).

Consequently, in the gyro vibrating element 1, the adjustment pattern P (equivalent to the electrode for adjustment) is included in determined one signal pattern (the second detection signal pattern S2). Therefore, unlike the related art (e.g., Patent Literature 1), it is unnecessary to provide electrodes for adjustment in a plurality of comb tooth shapes according to the number of detection signal wires.

For example, in the gyro vibrating element 1, by setting a sufficient difference between capacitances of the first detection signal pattern S1 and the second detection signal pattern S2 (C1<<C2) anticipating manufacturing variation in advance, it is possible to include the adjustment pattern P in one (the second detection signal pattern S2) of the first detection signal pattern S1 and the second detection signal pattern S2.

As a result, in the gyro vibrating element 1, it is possible to reduce a difference (C1–C2) between the capacitances of the first detection signal pattern S1 and the second detection signal pattern S2 using the adjustment pattern P for adjusting the area of the signal pattern, reduce imbalance of an unnecessary signal component, and achieve a further reduction in size and further improvement of productivity while improving detection accuracy of the angular velocity $\omega$.

The gyro vibrating element 1 is a vibrating element including the base section 10 and the first and second detection vibration arms 30 and 32 and the first to fourth drive vibration arms 40, 42, 44, and 46 functioning as the vibrating sections connected to the base section 10. The adjustment pattern P is disposed in the base section 10.

Consequently, in the gyro vibrating element 1, it is possible to further reduce the influence on the first and second detection vibration arms 30 and 32 and the first to fourth drive vibration arms 40, 42, 44, and 46 due to the adjustment of the area of the adjustment pattern P than when, for example, the adjustment pattern P is present in the bases of the vibration arms.

Note that the adjustment pattern P may be provided in the first detection signal pattern S1 or the drive signal pattern D1 instead of the second detection signal pattern S2 (see FIG. 3B).

Note that, in actual use, the gyro vibrating element 1 is housed in a container. The same applies to gyro vibrating elements explained below.

The adjustment of the area of the adjustment pattern P is explained as a manufacturing method for the gyro vibrating element 1.

The manufacturing method for the gyro vibrating element 1 includes a step of reducing, by changing the area of the adjustment pattern P, a difference between the capacitance C1 due to the capacitive coupling between the first detection signal pattern S1 and the drive signal pattern D1 and the capacitance C2 due to the capacitive coupling between the second detection signal pattern S2 and the drive signal pattern D1.

Specifically, the step of changing the area of the adjustment pattern P includes a step of, first, preparing the gyro vibrating element 1 in which the first detection signal pattern S1 or the second detection signal pattern S2 (the second detection signal pattern S2) includes the adjustment pattern P and the capacitance (C2) of the detection signal pattern including the adjustment pattern P is larger than the capacitance (C1) of the other (C2>C1).

Figure 7A:
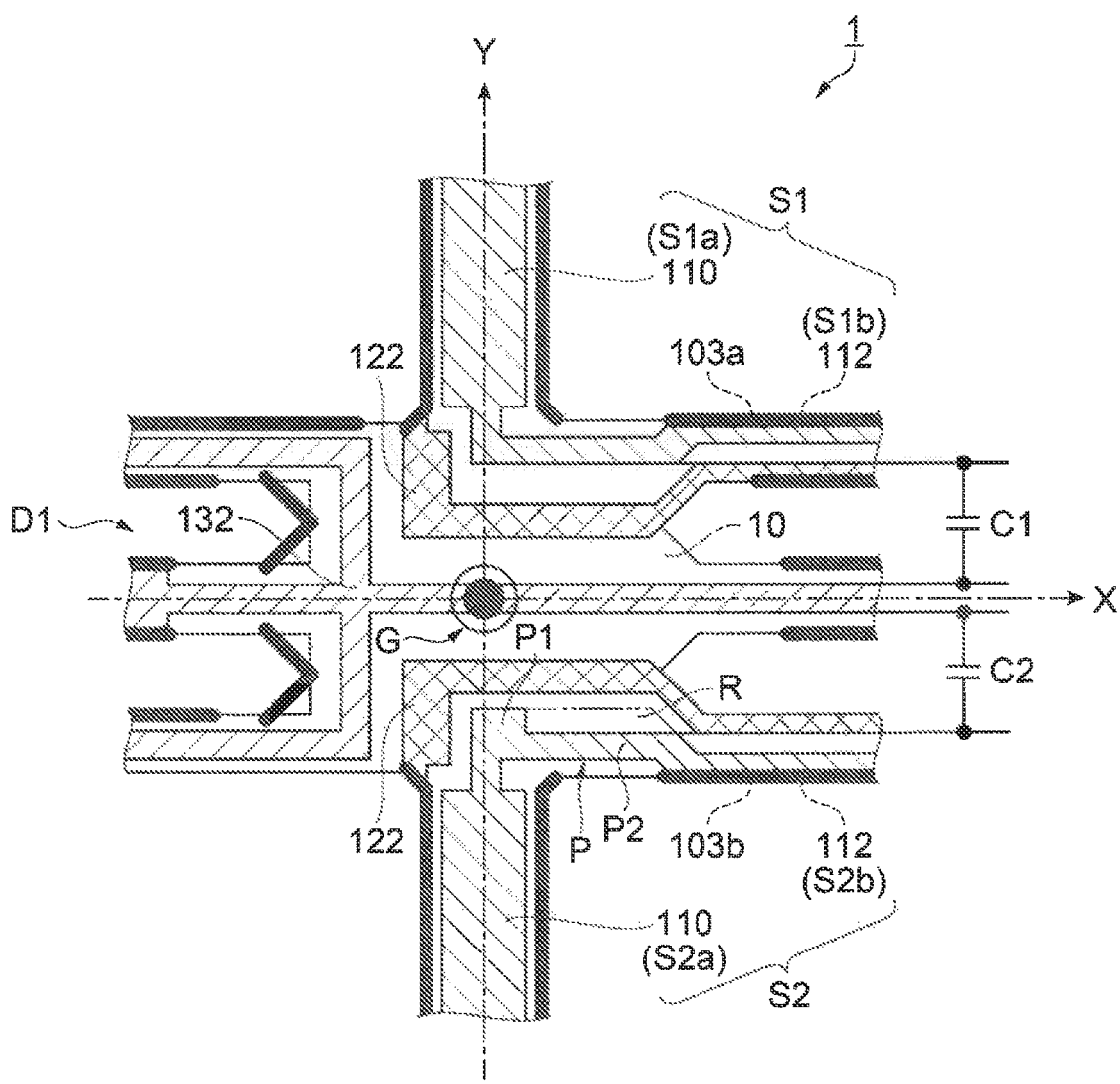
FIG. 7A is a main part enlarged view for explaining a manufacturing method for the gyro vibrating element.

Subsequently, as shown in a main part enlarged view for explaining the manufacturing method for the gyro vibration element shown in FIG. 7A, removing at least a part (a removed part R, which is a portion surrounded by an alternate long and two short dashes line shown in the figure) of the adjustment pattern P with an energy ray such as an ion beam, a laser beam, or an electron beam, and reducing the area of the adjustment pattern P (in other words, spacing apart the adjustment pattern P and the drive signal pattern D1).

Figure 7B:
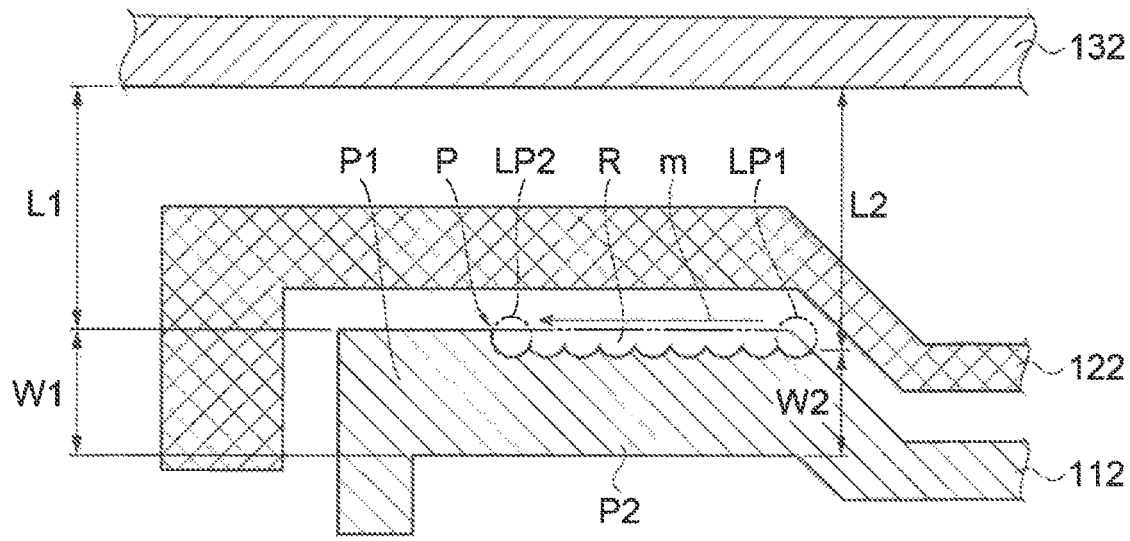
FIG. 7B is a main part enlarged view showing a specific example 1 of an adjusting method for the adjustment pattern.
Figure 7C:
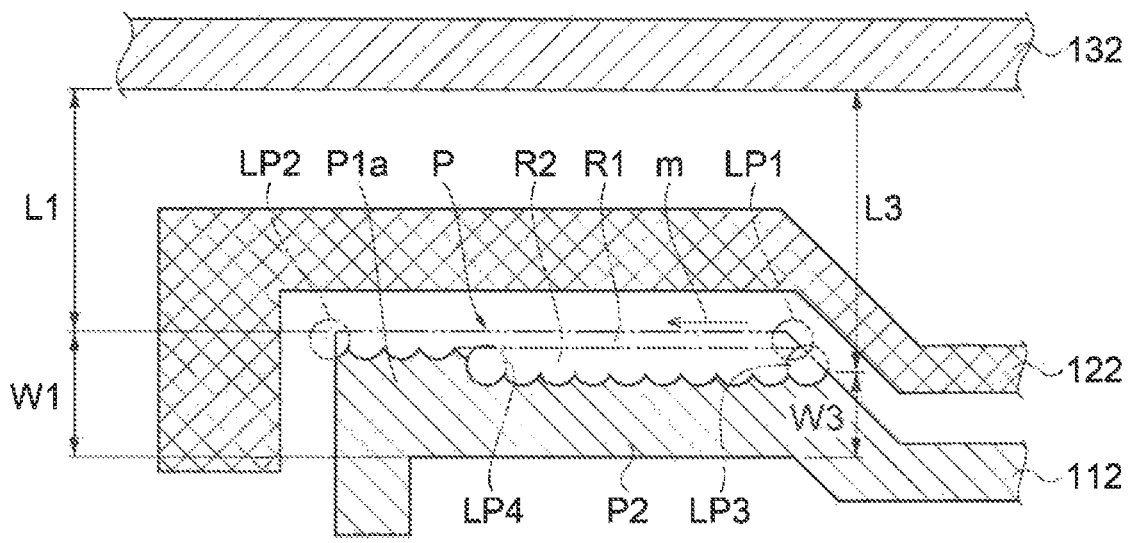
FIG. 7C is a main part enlarged view showing a specific example 2 of the adjusting method for the adjustment pattern.

An adjusting method for the area of the adjustment pattern P is explained in detail below with reference to FIGS. 7B and 7C. FIG. 7B is a main part enlarged view showing a specific example 1 of the adjusting method for the adjustment pattern. FIG. 7C is a main part enlarged view showing a specific example 2 of the adjusting method for the adjustment pattern. Note that, in FIGS. 7B and 7C, a method is illustrated in which the laser beam is used as the energy ray.

First, in a state in which angular velocity is not applied to the gyro vibrating element 1, the gyro vibrating element 1 is driven by the drive circuit 410.

Subsequently, in a state in which the gyro vibrating element 1 is driven, an output signal of the differential amplifier circuit 423 is measured by a measuring device such as an oscilloscope. The adjustment pattern P is trimmed using the energy ray such as the laser beam to reduce the output signal.

Specifically, as in the specific example 1 shown in FIG. 7B, the laser beam is moved in a direction of an arrow m in the figure from a position LP1 to a position LP2 where the output signal decreases to a predetermined output signal. According to the movement of the laser beam, the laser beam is radiated and the removed section R where the adjustment pattern P is removed is formed. Consequently, in the adjustment pattern P, the wide section P1 (the first pattern portion) and the narrow section P2 (the second pattern portion) are formed. The wide section P1 has the original width dimension of the adjustment pattern P, in other words, the width W1 (the first width) before the removal. The narrow section P2 has the width W2 with a small width dimension (the second width) as a result of removing a part (a portion indicated by an alternate long and two short dashes line in the figure) on the drive signal wire 132 (the drive signal pattern D1) side are formed.

In this way, in the specific example 1, the distance L1 between the adjustment pattern P and the drive signal wire 132 (the drive signal pattern D1) at the time of the width W1 changes to the distance L2 between the adjustment pattern P and the drive signal wire 132 (the drive signal pattern D1) at the time of the width W2 of the narrow section P2, whereby capacitance changes and capacitance adjustment can be performed.

In the specific example 2 shown in FIG. 7C, an example is shown in which the movement of the laser beam is repeated. As shown in FIG. 7C, first, as a first row, the laser beam is moved from the position LP1 in the direction the arrow m in the figure and reaches the position LP2 at the end of the adjustment pattern P. However, the output signal does not decrease to the predetermined output signal. In this case, further, as a second row, the laser beam is moved from a position LP3 in the direction of the arrow m in the figure to a position LP4 where the output signal decreases to the predetermined output signal. According to the movement of the laser beam from the position LP1 to the position LP4, the laser beam is radiated and removed sections (a removed section R1 in a first stage and a removed section R2 in a second stage) where the adjustment pattern P is removed are formed.

In this way, in the specific example 2, the distance L1 between the adjustment pattern P and the drive signal wire 132 (the drive signal pattern D1) at the time of the width W1 changes to a distance L3 between the adjustment pattern P and the drive signal wire 132 (the drive signal pattern D1) at the time of width W3 of the narrow section P2, whereby capacitance changes and capacitance adjustment can be performed.

Note that, in the removal of the adjustment pattern P by the radiation of the laser beam, an edge portion of the removed section R is not always linear and is often uneven or meandering. The edge portion of the removed section R often swells in the thickness direction because of a melting residue of the adjustment pattern P.

Note that, in the trimming, in a state in which the gyro vibrating element 1 is driven, it is also possible to measure output signals of the charge amplifier circuit 421 and the charge amplifier circuit 422 with a measuring device such as an oscilloscope and trim the adjustment pattern P with an energy ray such that the amplitude of the output signal of the charge amplifier circuit 421 and the amplitude of the output signal of the charge amplifier circuit 422 coincide with each other.

Consequently, it is possible to reduce a difference between the capacitance C2 and the capacitance C1.

The step of changing the area of the adjustment pattern P may include a step of, first, preparing the gyro vibrating element 1 in which the first detection signal pattern S1 or the second detection signal pattern S2 includes the adjustment pattern P and the capacitance of the detection signal pattern (e.g., the second detection signal pattern S2) including the adjustment pattern P is smaller than the capacitance of the other (C2<C1).

Subsequently, increasing the area of the adjustment pattern P with at least one of vapor deposition, sputtering, and an ion beam (in other words, reducing the interval between the adjustment pattern P and the drive signal pattern D1).

Consequently, it is possible to reduce the difference between the capacitance C2 and the capacitance C1.

As explained above, in the manufacturing method for the gyro vibrating element 1, the difference between the capacitance C1 between the first detection signal pattern S1 and the drive signal pattern D1 and the capacitance C2 between the second detection signal pattern S2 and the drive signal pattern D1 is reduced by changing the area of the adjustment pattern P. Therefore, the imbalance of the unnecessary signal component is reduced. It is possible to improve detection accuracy of the gyro vibrating element 1.

In the manufacturing method for the gyro vibrating element 1, the adjustment pattern P is included in any one (the second detection signal pattern S2) of the first detection signal pattern S1, the second detection signal pattern 52, and the drive signal pattern D1. Therefore, it is possible to achieve a further reduction in the size and further improvement of productivity of the gyro vibrating element 1 than when the patterns for adjustment P are included in the respective signal patterns.

The manufacturing method for the gyro vibrating element 1 includes the step of preparing the gyro vibrating element 1 in which the capacitance of the signal pattern including the adjustment pattern P is larger than the capacitance of the other signal pattern, removing at least a part of the adjustment pattern P with an energy ray, and reducing the area of the adjustment pattern P. Therefore, it is possible to surely reduce the difference (C1−C2) between the two capacitances.

Consequently, with the manufacturing method for the gyro vibrating element 1, the imbalance of the unnecessary signal component is reduced. It is possible to improve the detection accuracy of the gyro vibrating element 1.

The manufacturing method for the gyro vibrating element 1 includes the step of preparing the gyro vibrating element 1 in which the capacitance of the signal pattern including the adjustment pattern P is smaller than the capacitance of the other signal pattern and increasing the area of the adjustment pattern P with at least one of vapor deposition and sputtering. Therefore, it is possible to surely reduce the difference (C1−C2) between the two capacitances.

Consequently, with the manufacturing method for the gyro vibrating element 1, the imbalance of the unnecessary signal component is reduced. It is possible to improve the detection accuracy of the gyro vibrating element 1.

Note that the gyro vibrating element 1 may have a configuration in which the supporting sections and the beams are removed and the terminals are disposed on the second surface 102 of the base section 10. Consequently, it is possible to achieve a further reduction in the size of the gyro vibrating element 1.

Modification

A modification of the first embodiment is explained.

Figure 8:
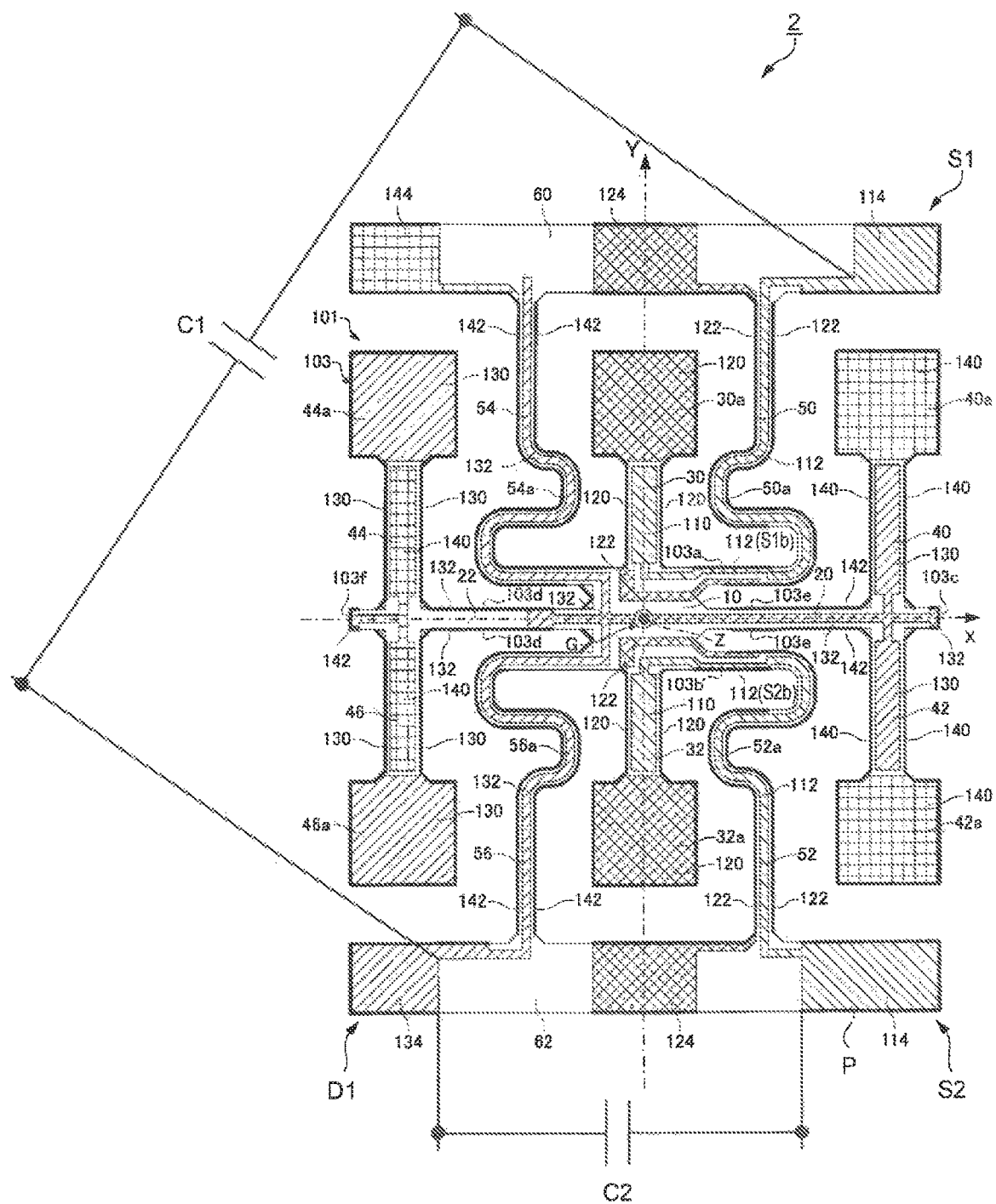
FIG. 8 is a plan view showing the configuration on one principal plane side of a gyro vibrating element in a modification of the first embodiment viewed from the one principal plane side.

FIG. 8 is a plan view showing the configuration on one principal plane side of a gyro vibrating element in a modification of the first embodiment viewed from the one principal plane side. Note that portions common to the first embodiment are denoted by the same reference numerals and signs and detailed explanation of the portions is omitted. Differences from the first embodiment are mainly explained.

As shown in FIG. 8, a gyro vibrating element 2 in the modification includes the first supporting section 60 and the second supporting section 62 functioning as fixed sections connected to the base section 10. The drive signal wires 132, the first detection signal wires S1*b*, and the second detection signal wires S2*b* are disposed in the base 10 and both of the first supporting section 60 and the second supporting section 62. The adjustment pattern P is disposed in the first supporting section 60 or the second supporting section 62 (disposed in the detection signal terminal 114 of the second supporting section 62).

As an example, anticipating manufacturing variation in advance, a sufficient difference is set between the capacitance C1 between the first detection signal pattern S1 and the drive signal pattern D1 and the capacitance C2 between the second detection signal pattern S2 and the drive signal pattern D1 (C1<<C2).

Consequently, in the gyro vibrating element 2, by adjusting the area of the adjustment pattern P with the method explained above, it is possible to reduce the difference between the capacitance C1 between the first detection signal pattern S1 and the drive signal pattern D1 and the capacitance C2 between the second detection signal pattern S2 and the drive signal pattern D1 and improve the detection accuracy.

As explained above, the gyro vibrating element 2 in the modification includes the first supporting section 60 and the second supporting section 62 connected to the base section 10. The adjustment pattern P is disposed in the first supporting section 60 or the second supporting section 62.

As a result, in the gyro vibrating element 2, it is possible to further reduce the influence on the first and second detection vibration arms 30 and 32 and the first to fourth drive vibration arms 40, 42, 44, and 46 functioning as the vibrating sections due to the adjustment of the area of the adjustment pattern P than when the adjustment pattern P is disposed in the base section 10.

In the gyro vibrating element 2, it is possible to further reduce the size of the base section 10 than when the adjustment pattern P is disposed in the base section 10.

Note that the adjustment pattern P may be provided on the other principal plane (the second surface 102) side.

Second Embodiment

A physical quantity sensor module serving as an example of a physical quantity detection device is explained.

Figure 9:
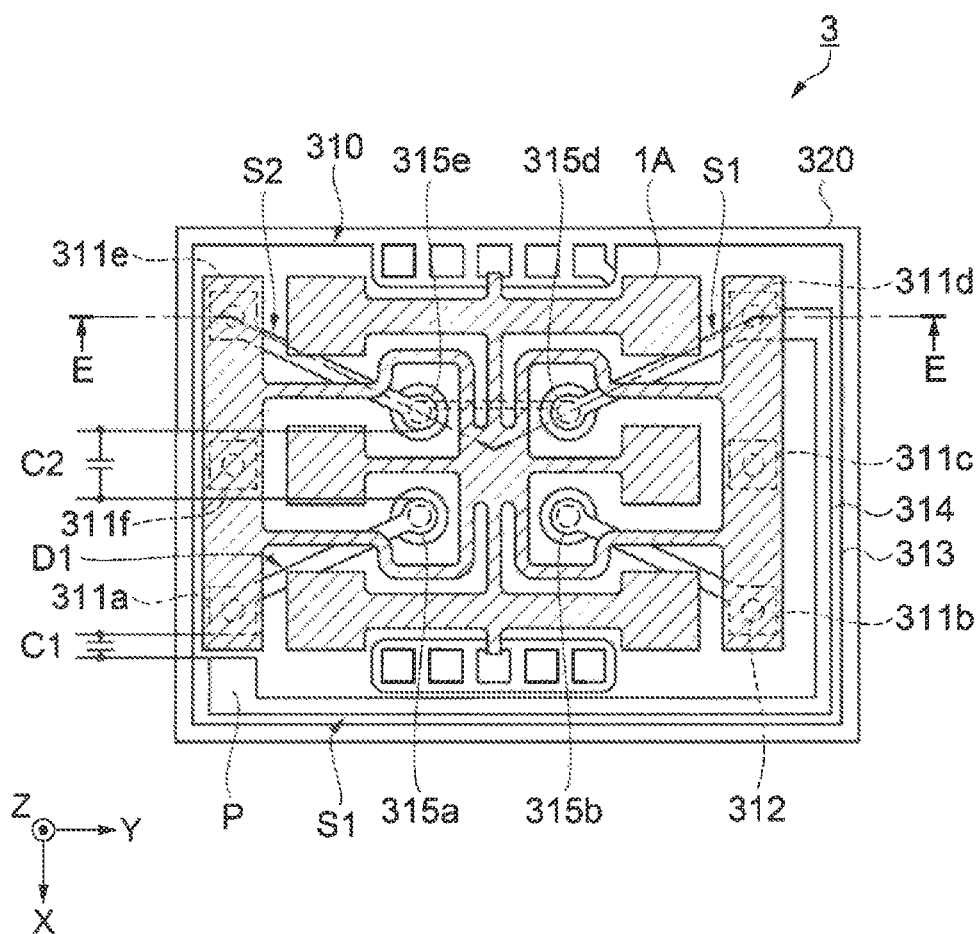
FIG. 9 is a plan view showing the configuration of a physical quantity sensor module in a second embodiment.
Figure 10:
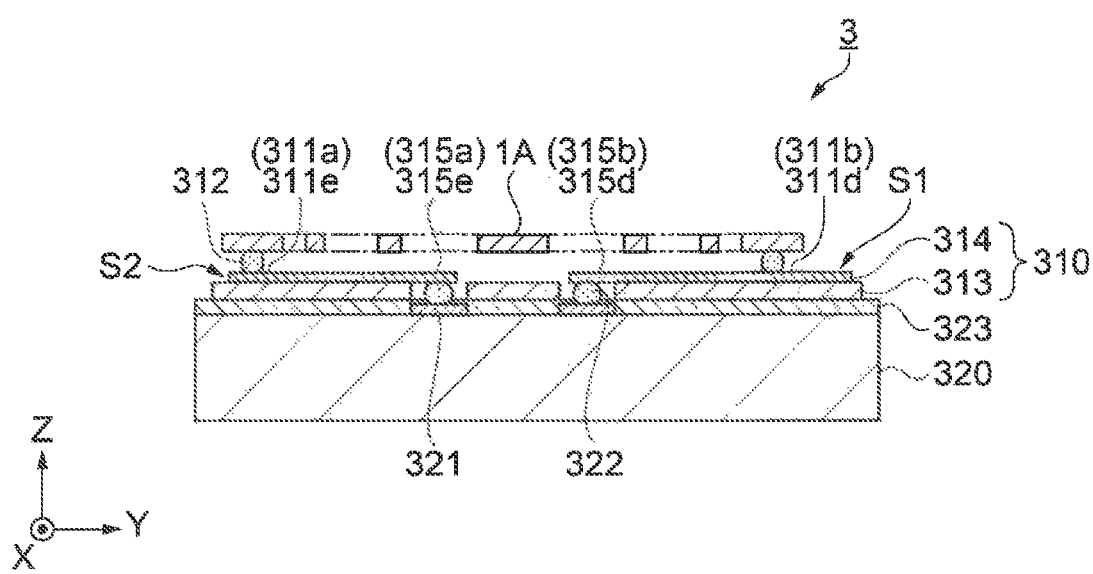
FIG. 10 is a sectional view taken along line E-E in FIG. 9.

FIG. 9 is a plan view showing the configuration of a physical quantity sensor module in a second embodiment. FIG. 10 is a sectional view taken along line E-E in FIG. 9. Note that portions common to the first embodiment are denoted by the same reference numerals and signs and detailed explanation of the portions is omitted. Differences from the first embodiment are mainly explained.

As shown in FIGS. 9 and 10, a physical quantity sensor module 3 includes a gyro vibrating element 1A functioning as a vibrating element and the IC chip 320 functioning as an electronic element electrically connected to the gyro vibrating element 1A by a relay board 310. Note that hatching is applied to the gyro vibrating element 1A in the plan view in order to clearly show the gyro vibrating element 1A.

In the physical quantity sensor module 3, the drive signal pattern D1, the first detection signal pattern S1, and the second detection signal pattern S2 are disposed across the gyro vibrating element 1A and the relay board 310.

In the physical quantity sensor module 3, the adjustment pattern P is disposed on the relay board 310.

Specifically, in the physical quantity sensor module 3, for example, the gyro vibrating element 1A having a configuration in which the adjustment pattern P is removed from the gyro vibrating element 1 is mounted on the relay board 310 having a substantially rectangular flat shape. Terminals (not shown in the figures) of the gyro vibrating element 1A are electrically and mechanically connected to relay terminals 311a to 311f of the relay board 310 by joining members 312 such as metal bumps.

The relay board 310 includes a board main body 313 made of resin such as polyimide and a wiring pattern 314 made of metal foil of copper or the like stacked on the gyro vibrating element 1A side of the board main body 313.

In the wiring pattern 314, portions opposed to the terminals of the gyro vibrating element 1A are the relay terminals 311a to 311f and portions opposed to connection pads 321 provided in substantially the center of the IC chip 320 are connection terminals 315a, 315b, 315d, and 315e. Note that through-holes are provided in the board main body 313 in the portions of the connection terminals 315a, 315b, 315d, and 315e.

The relay terminal 311a is connected to the connection terminal 315a, a relay terminal 311b is connected to the connection terminal 315b, a relay terminal 311d is connected to the connection terminal 315d, and a relay terminal 311e is connected to the connection terminal 315e.

The relay board 310 is mounted on a passivation film 323 of the IC chip 320. The connection terminals 315a, 315b, 315d, and 315e are electrically connected to the connection pads 321 of the IC chip 320 by joining members 322 such as metal bumps.

Consequently, the gyro vibrating element 1A and the IC chip 320 are electrically connected.

The connection pads 321 of the IC chip 320 are connected to the drive circuit 410 and the detection circuit 420. The wiring pattern 314 that connects the relay terminal 311a and the connection terminal 315a of the relay board 310 is the drive signal pattern D1. The wiring pattern 314 that connects the relay terminal 311d and the connection terminal 315d is the first detection signal pattern S1. The wiring pattern 314 that connects the relay terminal 311e and the connection terminal 315e is the second detection signal pattern S2.

Note that the first detection signal pattern S1 is drawn around clockwise along the outer periphery of the relay board 310 and reaches the vicinity of the relay terminal 311a. The distal end portion of the first detection signal pattern S1 reaching the vicinity of the relay terminal 311a is the adjustment pattern P.

In the physical quantity sensor module 3, a sufficient difference is set between the capacitance C1 between the first detection signal pattern S1 and the drive signal pattern D1 and the capacitance C2 between the second detection signal pattern S2 and the drive signal pattern D1 (C1>>C2) anticipating manufacturing variation in advance.

Consequently, in the physical quantity sensor module 3, by adjusting the area of the adjustment pattern P with the method explained in the first embodiment, it is possible to reduce the difference between the capacitance C1 between the first detection signal pattern S1 and the drive signal pattern D1 and the capacitance C2 between the second detection signal pattern S2 and the drive signal pattern D1 and improve the detection accuracy.

As explained above, the physical quantity sensor module 3 in the second embodiment includes the gyro vibrating element 1A and the IC chip 320 electrically connected to the gyro vibrating element 1A by the relay board 310. Since the adjustment pattern P is disposed on the relay board 310, it is possible to further reduce the sizes of the gyro vibrating element 1A and the IC chip 320 than when the adjustment pattern P is disposed in the gyro vibrating element 1A or the IC chip 320.

Consequently, in the physical quantity sensor module 3, design flexibility of the gyro vibrating element 1A is improved.

Note that the adjustment pattern P may be provided in the second detection signal pattern S2 or the drive signal pattern D1 instead of the first detection signal pattern S1.

Third Embodiment

An H-type gyro vibrating element serving as an example of a physical quantity detection device is explained.

Figure 11:
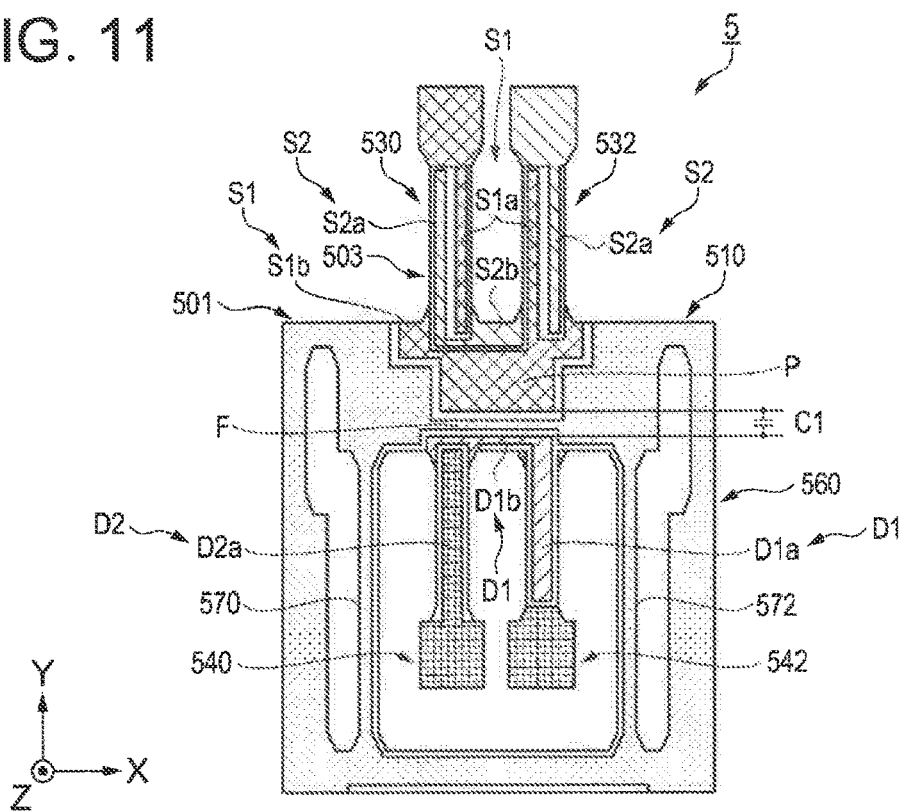
FIG. 11 is a plan view showing the configuration on one principal plane side of a gyro vibrating element in a third embodiment viewed from the one principal plane side.
Figure 12:
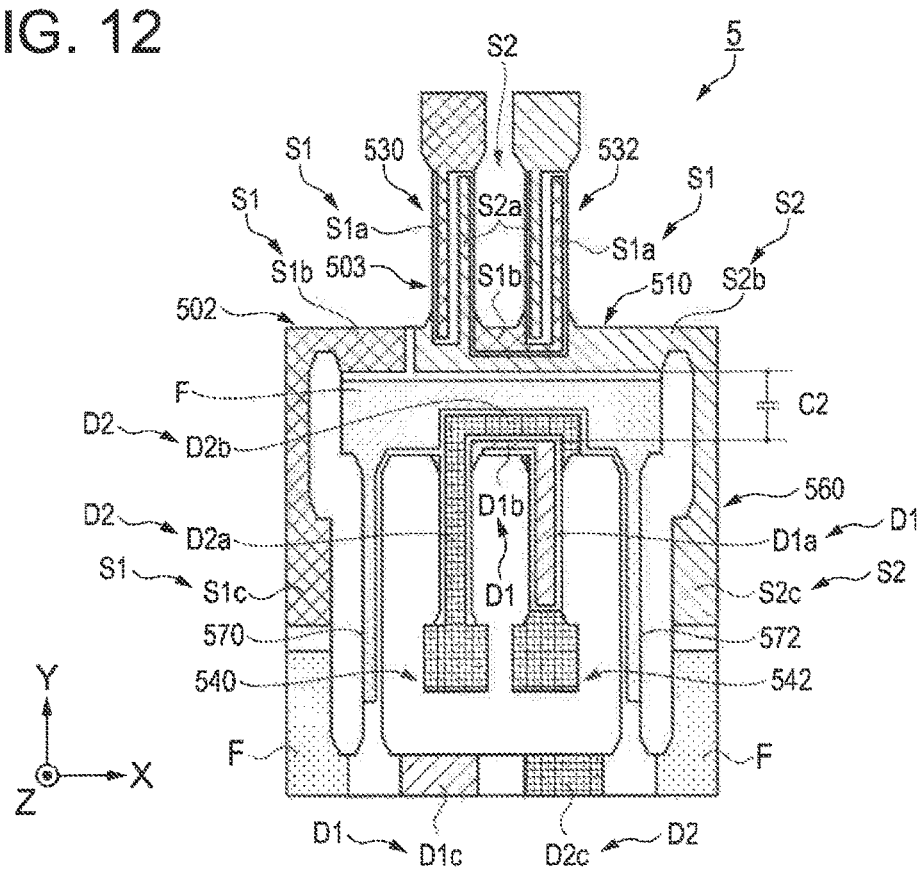
FIG. 12 is a plan view showing the configuration on the other principal plane side seen through from the one principal plane side of the gyro vibrating element in the third embodiment.

FIG. 11 is a plan view showing the configuration on one principal plane side of a gyro vibrating element in a third embodiment viewed from the one principal plane side. FIG. 12 is a plan view showing the configuration on the other principal plane side seen through from the one principal plane side of the gyro vibrating element.

Note that the basic configuration in this embodiment is the same as the basic configuration in the first embodiment. Therefore, the gist of this embodiment is mainly explained.

As shown in FIGS. 11 and 12, an H-type gyro vibrating element 5 includes a base section 510, first and second detection vibration arms 530 and 532 and first and second drive vibration arms 540 and 542 functioning as vibrating sections connected to the base section 510, and a fixed section 560 connected to the base section 510.

The gyro vibrating element 5 includes a first surface 501 (one principal plane) and a second surface 502 (the other principal plane) facing opposite directions each other and a side surface 503 that connects the first surface 501 and the second surface 502. The first surface 501 and the second surface 502 are surfaces parallel to the XY plane. The second surface 502 is a surface opposed to the inner side bottom surface of a container (not shown in the figure) in which the gyro vibrating element 5 is housed.

The side surface 503 is a surface orthogonal to the first surface 501 and the second surface 502 and parallel to the Z axis.

The first and second detection vibration arms 530 and 532 extend from the substantially rectangular base section 510 in the positive direction along the Y axis.

The first and second drive vibration arms 540 and 542 extend from the base section 510 in the negative direction along the Y axis.

Note that the first and second detection vibration arms 530 and 532 and the first and second drive vibration arms 540 and 542 include groove sections. However, the groove sections are omitted to avoid complication of the figures.

The fixed section 560 is provided to bend while extending from the base section 510 in the positive and negative directions along the X axis and surround the first and second drive vibration arms 540 and 542. On both sides of the first and second drive vibration arms 540 and 542, beams 570 and 572 that connect the base section 510 and the fixed section 560 extend along the Y axis.

The gyro vibrating element 5 includes drive signal patterns D1 and D2 including drive electrodes D1a and D2a to which a drive signal is applied and drive signal wires D1b and D2b connected to the drive electrode D1a and the first detection signal pattern S1 including the first detection electrode S1a that outputs a first detection signal and the first detection signal wire S1b connected to the first detection electrode S1a, the first detection signal pattern S1 being capacitively coupled to the drive signal pattern D1 with the capacitance C1. Note that the drive electrode D2a plays a function same as the function of the drive ground electrode (140) in the first embodiment.

Further, the gyro vibrating element 5 includes the second detection signal pattern S2 including the second detection electrode S2a that outputs a second detection signal opposite in phase to the first detection signal and the second detection signal wire S2b connected to the second detection electrode S2a, the second detection signal pattern S2 being capacitively coupled to the drive signal pattern D1 with the capacitance C2.

In the gyro vibrating element 5, any one (the first detection signal pattern S1) of the first detection signal pattern S1, the second detection signal pattern S2, and the drive signal pattern D1 includes the adjustment pattern P that adjusts the area of the signal pattern (the first detection signal pattern S1).

Specifically, the drive electrodes D1a and D2a are disposed in the first and second drive vibration arms 540 and 542. The first detection electrode S1a and the second detection electrode S2a are disposed in the first and second detection vibration arms 530 and 532.

The drive signal wires D1b and D2b, the first detection signal wire S1b, and the second detection signal wire S2b are disposed in the base section 510. The adjustment pattern P is disposed in the first detection signal wire S1b on the first surface 501 of the base section 510. The adjustment pattern P is disposed to project in a substantially rectangular shape in the negative direction along the Y axis.

Drive signal terminals D1c and D2c are disposed on the second surface 502 in positions opposed to the first and second drive vibration arms 540 and 542 in portions of the fixed section 560 extending along the X axis. A first detection signal terminal Sic and a second detection signal terminal S2c are disposed on the second surface 502 respectively substantially in the centers of portions extending along the Y axis of the fixed section 560.

The drive signal terminals D1c and D2c, the first detection signal terminal S1c, and the second detection signal terminal S2c are respectively connected to the electrodes (D1a, etc.) through the wires (D1b, etc.).

Note that the electrodes and the wires are disposed on the side surface 503 as well and extend to the first surface 501 and the second surface 502 through the side surface 503.

In the gyro vibrating element 5, the adjustment pattern P and the signal pattern to be capacitively coupled (the drive signal pattern D1) among the drive signal pattern D1, the first detection signal pattern S1, and the second detection signal pattern S2 are disposed to be opposed to each other. A constant potential pattern F is disposed between the adjustment pattern P and the drive signal pattern D1 (D1b).

Note that the constant potential pattern F is set to the ground potential. The constant potential pattern F is disposed in most portions of spaces other than the drive signal pattern D1, the first detection signal pattern S1, and the second detection signal pattern S2 to play a function of reducing intrusion of noise and the like.

An overview of the operation of the gyro vibrating element 5 is explained.

Figure 13:
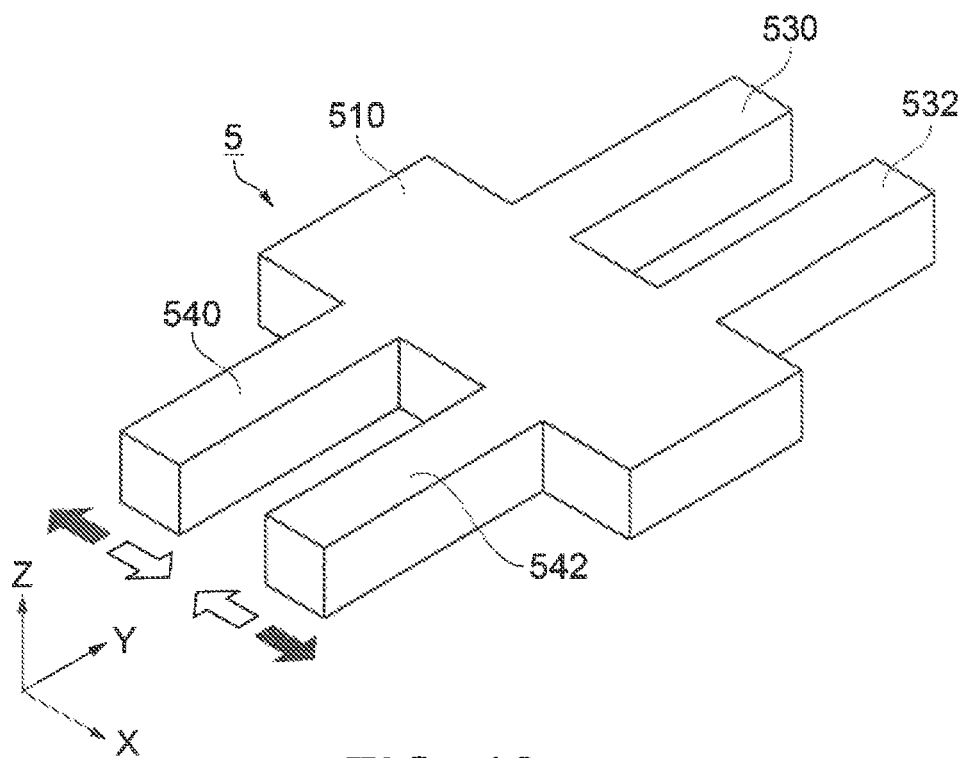
FIG. 13 is a schematic perspective view showing a drive vibration state of the gyro vibrating element.
Figure 14:
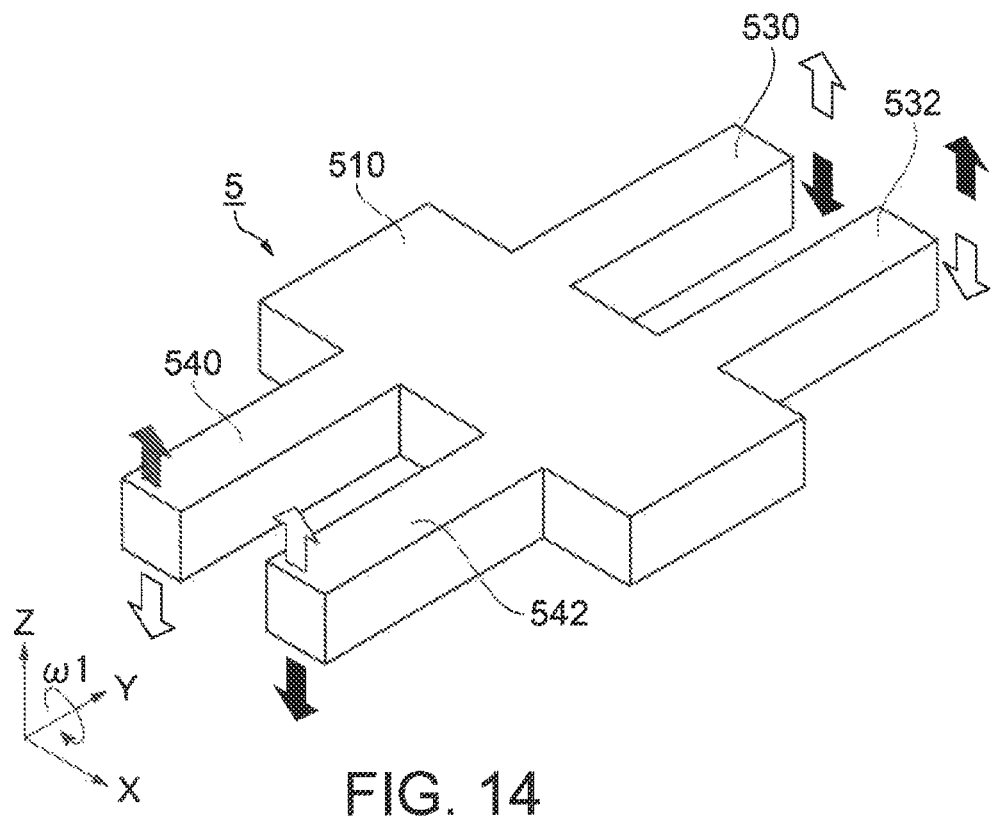
FIG. 14 is a schematic perspective view showing a detection vibration state of the gyro vibrating element.

FIG. 13 is a schematic perspective view showing a drive vibration state of the gyro vibrating element. FIG. 14 is a schematic perspective view showing a detection vibration state of the gyro vibrating element. Note that, in FIGS. 13 and 14, for convenience of explanation, the shape of the gyro vibrating element is simplified and the fixed section is omitted.

As shown in FIG. 13, a drive signal is applied to the drive electrodes (D1a and D2a; not shown in the figure) provided in the first and second drive vibration arms 540 and 542, whereby the gyro vibrating element 5 performs drive vibration in which the first and second drive vibration arms 540 and 542 alternately bend and vibrate in a direction (white arrows) in which the first and second drive vibration arms 540 and 542 approach each other along the X axis and a direction (black arrows) in which the first and second drive vibration arms 540 and 542 separate from each other.

In this drive vibration state, as shown in FIG. 14, when angular velocity ω1 is applied around the Y axis (in other words, when the gyro vibrating element 5 rotates about the Y axis), the gyro vibrating element 5 performs detection vibration in which the first and second drive vibration arms 540 and 542 and the first and second detection vibration arms 530 and 532 alternately bend and vibrate in the positive direction and the negative direction along the Z axis with a Coriolis force.

Specifically, the gyro vibrating element 5 performs detection vibration in which, when the first drive vibration arm 540 and the second detection vibration arm 532 bend in the positive direction, the second drive vibration arm 542 and the first detection vibration arm 530 bend in the negative direction (black arrows) and, when the first drive vibration arm 540 and the second detection vibration arm 532 bend in the negative direction, the second drive vibration arm 542 and the first detection vibration arm 530 bend in the positive direction (white arrows).

The gyro vibrating element 5 can derive the angular velocity ω1 by extracting, as a first detection signal and a second detection signal, electric charge generated in the first and second detection electrodes (S1a and S2a; not shown in the figure) provided in the first and second detection vibration arms 530 and 532 according to the detection vibration.

Referring back to FIGS. 11 and 12, in the gyro vibrating element 5, the adjustment pattern P is provided in the first detection signal pattern S1 and a sufficient difference is set between capacitances of the first detection signal pattern S1 and the second detection signal pattern S2 (C1>>C2) anticipating manufacturing variation in advance.

Consequently, in the gyro vibrating element 5, by adjusting the area of the adjustment pattern P with the method explained in the first embodiment, it is possible to reduce the difference between the capacitance C1 between the first detection signal pattern S1 and the drive signal pattern D1 and the capacitance C2 between the second detection signal pattern S2 and the drive signal pattern D1 and improve detection accuracy of the angular velocity ω1.

As explained above, in the gyro vibrating element 5 in the third embodiment, as in the first embodiment, the adjustment pattern P is included in determined one signal pattern (the first detection signal pattern S1). Therefore, unlike the related art (e.g., Patent Literature 1), it is unnecessary to provide electrodes for adjustment in a plurality of comb tooth shapes according to the number of detection signal wires.

As a result, in the gyro vibrating element 5, it is possible to reduce a difference (C1−C2) between the capacitances of the first detection signal pattern S1 and the second detection signal pattern S2 using the adjustment pattern P and achieve a further reduction in size and further improvement of productivity while improving detection accuracy of the angular velocity ω1.

As in the first embodiment, the gyro vibrating element 5 is the vibrating element including the base section 510 and the first and second detection vibration arms 530 and 532 and the first and second drive vibration arms 540 and 542 connected to the base section 510. The adjustment pattern P is disposed in the base section 510. Therefore, it is possible to further reduce the influence on the first and second detection vibration arms 530 and 532 and the first and second drive vibration arms 540 and 542 due to the adjustment of the area of the adjustment pattern P than when, for example, the adjustment pattern P is present in the bases of the vibration arms.

In the gyro vibrating element 5, the constant potential pattern F is disposed between the adjustment pattern P and the signal pattern to be capacitively coupled (the drive signal pattern D1). Therefore, it is possible to further reduce the capacitance C1 between the adjustment pattern P and the drive signal pattern D1 involved in the capacitive coupling than when the constant potential pattern F is not disposed.

Note that, in the gyro vibrating element 5, the adjustment pattern P may be included in the second detection signal pattern S2 or the drive signal pattern D1 instead of the first detection signal pattern S1. In this case, the gyro vibrating element 5 can achieve effects same as the effects explained above. This configuration can also be applied to modifications explained below.

The gyro vibrating element 5 may have a configuration in which the fixed section 560 is removed and the terminals are provided on the second surface 502 of the base section 510. Consequently, the gyro vibrating element 5 can achieve a further reduction in size. This configuration can also be applied to modifications 1 to 3 explained below.

Modifications of the third embodiment are explained.
Modification 1

Figure 15:
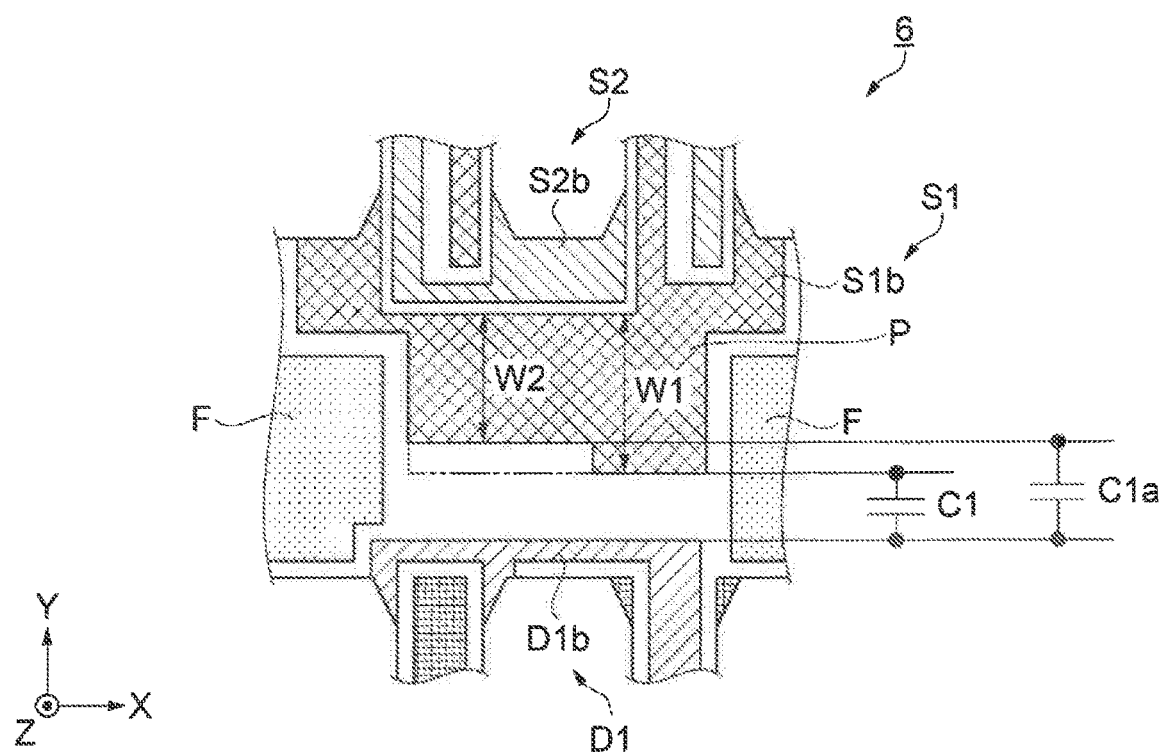
FIG. 15 is a main part enlarged plan view showing the configuration of a gyro vibrating element in a modification 1 of the third embodiment.

FIG. 15 is a main part enlarged plan view showing the configuration of a gyro vibrating element in a modification 1 of the third embodiment. Note that portions common to the third embodiment are denoted by the same reference numerals and signs and detailed explanation of the portions is omitted. Differences from the third embodiment are mainly explained.

As shown in FIG. 15, in a gyro vibrating element 6 in the modification 1, the adjustment pattern P and a signal pattern to be capacitively coupled (the drive signal pattern D1) among the drive signal pattern D1, the first detection signal pattern S1, and the second detection signal pattern S2 are disposed to be opposed to each other. A region not electrostatically shielded is present (in other words, a region where the constant potential pattern F is not disposed is present) between the adjustment pattern P and the signal pattern D1.

Consequently, in the gyro vibrating element 6, the region not electrostatically shielded (the region where the constant potential pattern F is not disposed) is present between the adjustment pattern P and the signal pattern to be capacitively coupled (the drive signal pattern D1). Therefore, the capacitance C1 between the adjustment pattern P (the first detection signal pattern S1) and the drive signal pattern D1 is larger than when the constant potential pattern F is disposed.

Therefore, in the gyro vibrating element 6, by adjusting the area of the adjustment pattern P, even if an adjustment amount is the same, it is possible to further increase a change in the capacitance C1 than when the constant potential pattern F is disposed.

As a result, in the gyro vibrating element 6, with the method explained in the first embodiment, a narrow section having the width W2 of the small width dimension is formed by, for example, removing a part (a portion indicated by an alternate long and short two dashes line in the figure) on the drive signal wire D1b side of the adjustment pattern P having the width W1. In this way, the distance between the adjustment pattern P and the drive signal wire D1b at the time of the width W1 changes to the distance between the adjustment pattern P and the drive signal wire D1b at the time of the width W2 of the narrow section, whereby capacitance adjustment can be performed. Specifically, the capacitance C1 between the adjustment pattern P and the drive signal wire D1b changes to capacitance C1a. By adjusting the area of the adjustment pattern P, that is, changing the distance between the adjustment pattern P and the drive signal wire D1b in this way, it is possible to reduce the difference between the capacitance C1 between the first detection signal pattern S1 and the drive signal pattern D1 and the capacitance C2 (see FIG. 12) between the second detection signal pattern S2 and the drive signal pattern D1 and improve the detection accuracy of the angular velocity ω1.

Modification 2

Figure 16:
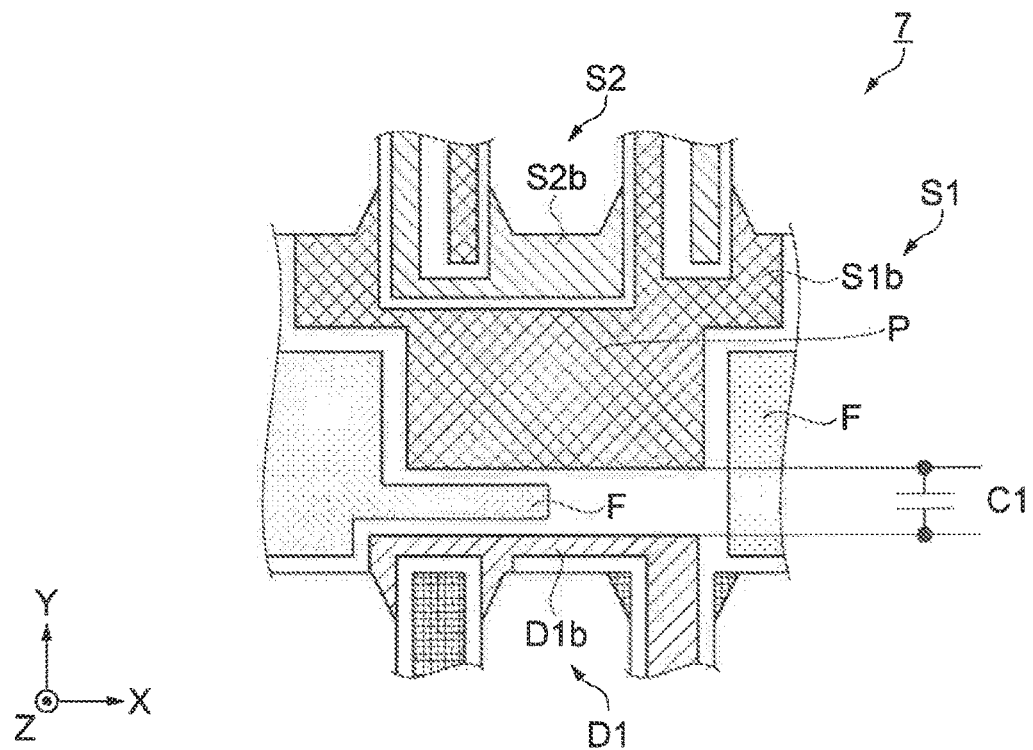
FIG. 16 is a main part enlarged plan view showing the configuration of a gyro vibrating element in a modification 2 of the third embodiment.

FIG. 16 is a main part enlarged plan view showing the configuration of a gyro vibrating element in a modification 2 of the third embodiment. Note that portions common to the third embodiment are denoted by the same reference numerals and signs and detailed explanation of the portions is omitted. Differences from the third embodiment are mainly explained.

As shown in FIG. 16, in a gyro vibrating element 7 in the modification 2, the adjustment pattern P and a signal pattern to be capacitively coupled (the drive signal pattern D1) among the drive signal pattern D1, the first detection signal pattern S1, and the second detection signal pattern S2 are disposed to be opposed to each other. A region where the constant potential pattern F is disposed and a region not electrostatically shielded (a region where the constant potential pattern F is not disposed) are present between the adjustment pattern P and the signal pattern D1.

Consequently, in the gyro vibrating element 7, the region where the constant potential pattern F is disposed and the region not electrostatically shielded (the region where the constant potential pattern F is not disposed) are present between the adjustment pattern P and the signal pattern D1 (the drive signal pattern). Therefore, it is possible to increase and reduce a change in the capacitance C1 according to a place where the area of the adjustment pattern P is adjusted.

Specifically, in the gyro vibrating element 7, it is possible to perform rough adjustment of the capacitance C1 by adjusting the area of a portion corresponding to the region where the constant potential pattern F is not disposed (the capacitance C1 is large). It is possible to perform fine adjustment of the capacitance C1 by adjusting the area of a portion corresponding to the region where the constant potential pattern F is disposed (the capacitance C1 is small).

As a result, in the gyro vibrating element 7, by adjusting the area of the adjustment pattern P with the method explained in the first embodiment, it is possible to reduce the difference between the capacitance C1 between the first detection signal pattern S1 and the drive signal pattern D1 and the capacitance C2 (see FIG. 12) between the second detection signal pattern S2 and the drive signal pattern D1 and improve the detection accuracy of the angular velocity ω1.

Modification 3

Figure 17:
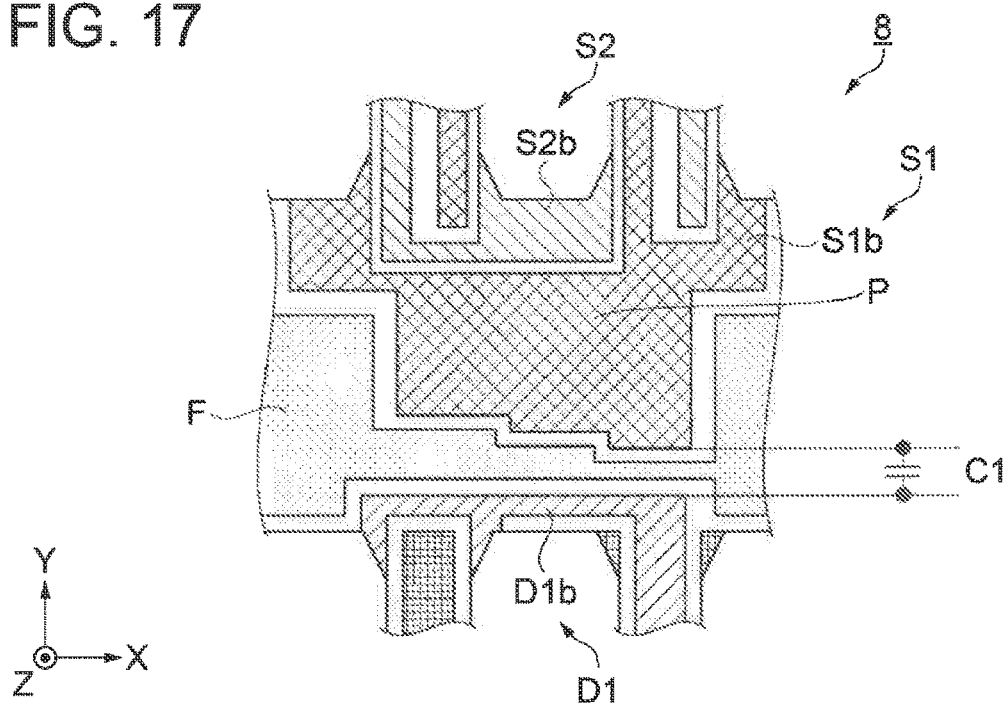
FIG. 17 is a main part enlarged plan view showing the configuration of a gyro vibrating element in a modification 3 of the third embodiment.

FIG. 17 is a main part enlarged plan view showing the configuration of a gyro vibrating element in a modification 3 of the third embodiment. Note that portions common to the third embodiment are denoted by the same reference numerals and signs and detailed explanation of the portions is omitted.

Differences from the third embodiment are mainly explained.

As shown in FIG. 17, in a gyro vibrating element 8 in the modification 3, the adjustment pattern P and a signal pattern to be capacitively coupled (the drive signal pattern D1) among the drive signal pattern D1, the first detection signal pattern S1, and the second detection signal pattern S2 are disposed to be opposed to each other. An end portion of the adjustment pattern P on the drive signal pattern D1 side is formed in a step shape.

Consequently, in the gyro vibrating element 8, the end portion of the adjustment pattern P on the drive signal pattern D1 side is formed in the step shape. Therefore, it is possible to increase and reduce a change in the capacitance C1 according to a place where the area of the adjustment pattern P is adjusted (a distance from the drive signal pattern D1 to a step portion to be adjusted).

As a result, in the gyro vibrating element 8, by adjusting the area of the adjustment pattern P with the method explained in the first embodiment, it is possible to reduce the difference between the capacitance C1 between the first detection signal pattern S1 and the drive signal pattern D1 and the capacitance C2 (see FIG. 12) between the second detection signal pattern S2 and the drive signal pattern D1 and improve the detection accuracy of the angular velocity ω1.

Modification 4

Figure 18:
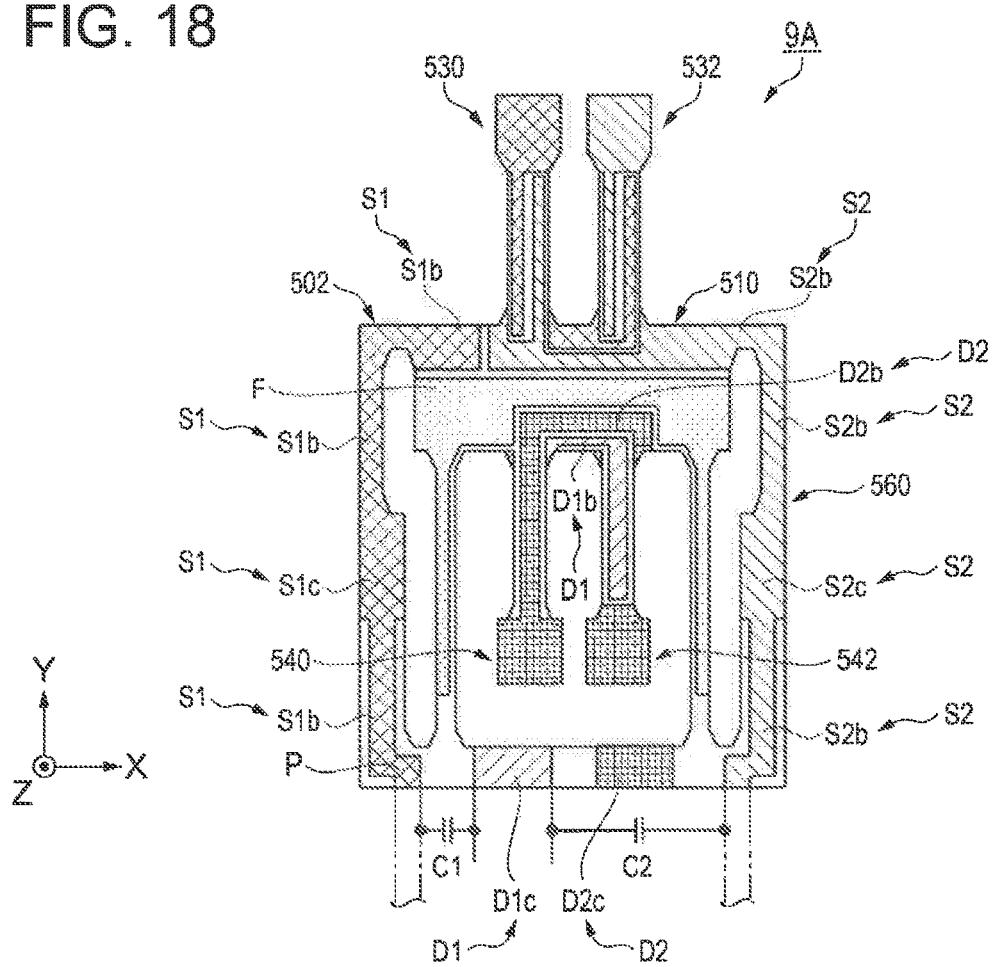
FIG. 18 is a plan view showing the configuration on the other principal plane side seen through from one principal plane side of a gyro vibrating element in a modification 4 of the third embodiment.

FIG. 18 is a plan view showing the configuration on the other principal plane side seen through from one principal plane side of a gyro vibrating element in a modification 4 of the third embodiment. Note that portions common to the third embodiment are denoted by the same reference numerals and signs and detailed explanation of the portions is omitted. Differences from the third embodiment are mainly explained.

As shown in FIG. 18, a gyro vibrating element 9A in the modification 4 includes the fixed section 560 connected to the base section 510. The drive signal wires D1b and D2b, the first detection signal wires S1b, and the second detection signal wires S2b are disposed in both of the base section 510 and the fixed section 560. The adjustment pattern P is disposed in the fixed section 560.

Specifically, the adjustment pattern P is included, in the first detection signal wire S1b, in a portion extending from the first detection signal terminal S1c in the negative direction of the Y axis along the shape of the fixed section 560 and disposed to the vicinity of the drive signal terminal D1c.

Note that, from the second detection signal terminal S2c, the second detection signal wire S2b (the second detection signal pattern S2) extends in the negative direction of the Y axis along the shape of the fixed section 560 and is disposed to the vicinity of the drive signal terminal D2c.

In the gyro vibrating element 9A, the adjustment pattern P is provided in the first detection signal wire S1b (the first detection signal pattern S1) of the fixed section 560. A sufficient difference is set between capacitances of the first detection signal pattern S1 and the second detection signal pattern S2 (C1>>C2) anticipating manufacturing variation in advance.

Consequently, in the gyro vibrating element 9A, by adjusting the area of the adjustment pattern P with the method explained in the first embodiment, it is possible to reduce the difference between the capacitance C1 between the first detection signal pattern S1 and the drive signal pattern D1 and the capacitance C2 between the second detection signal pattern S2 and the drive signal pattern D1 and improve detection accuracy of the angular velocity ω1.

As explained above, the gyro vibrating element 9A in the modification 4 includes the fixed section 560 connected to the base section 510. The adjustment pattern P is disposed in the fixed section 560. Therefore, it is possible to further reduce the influence on the first and second detection vibration arms 530 and 532 and the first and second drive vibration arms 540 and 542 due to the adjustment of the area of the adjustment pattern P than when, for example, the adjustment pattern P is present in the base section 510.

In the gyro vibrating element 9A, it is possible to further reduce the size of the base section 510 than when the adjustment pattern P is disposed in the base section 510.

Note that, in the gyro vibrating element 9A, the first detection signal wire S1b extending from the first detection signal terminal S1c and including the adjustment pattern P and the second detection signal wire S2b extending from the second detection signal terminal S2c and extending in parallel to the first detection signal wire S1b may also function as wires for inspection and adjustment in a wafer state before singulation as indicated by alternate long and two short dashes lines.

Consequently, in the gyro vibrating element 9A, it is unnecessary to prepare the adjustment pattern P for exclusive use. Therefore, it is possible to achieve a reduction in the size of the gyro vibrating element 9A.

Fourth Embodiment

A physical quantity sensor serving as an example of a physical quantity detection device is explained.

Figure 19:
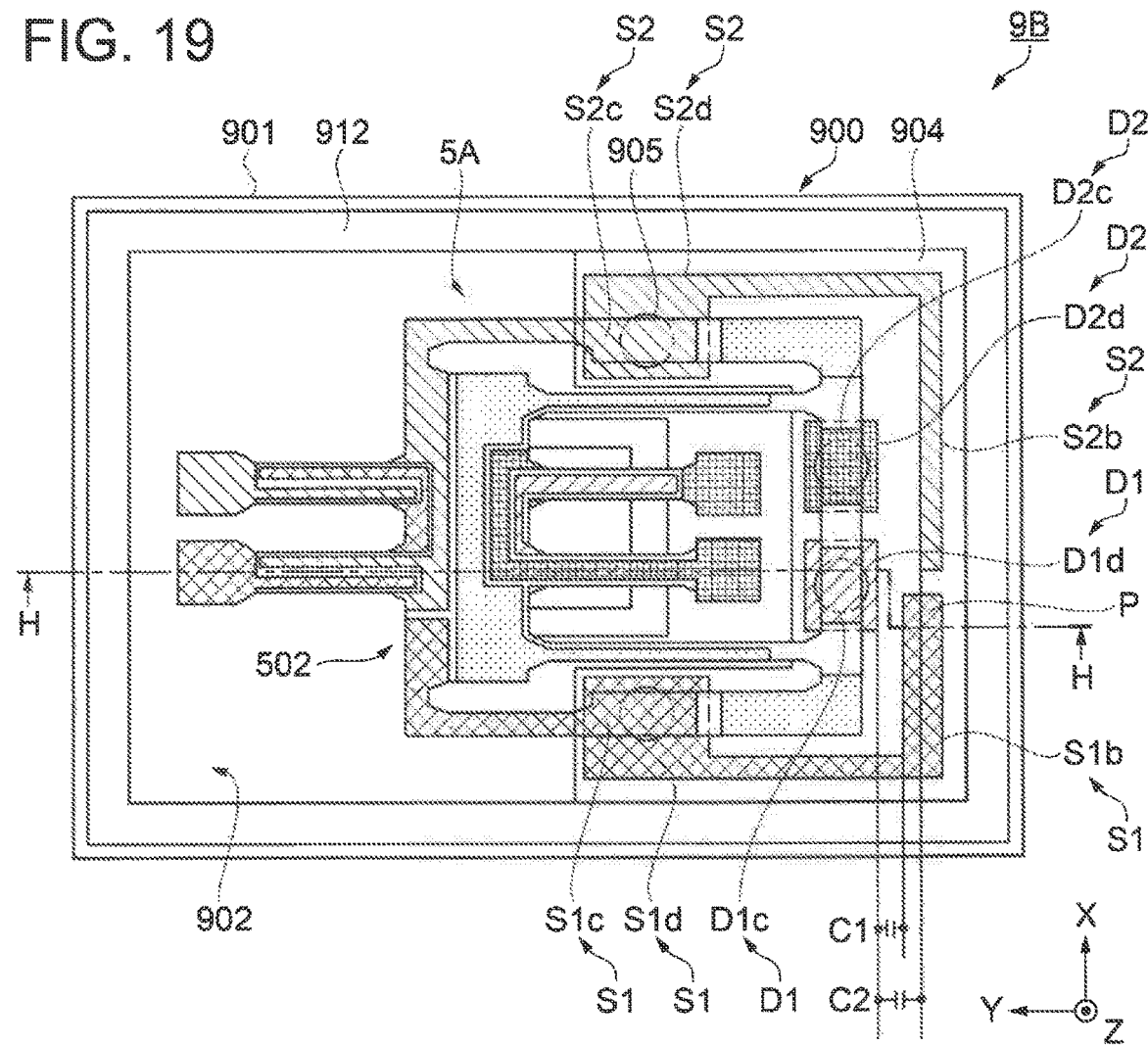
FIG. 19 is a plan view showing the configuration of a physical quantity sensor in a fourth embodiment.
Figure 20:
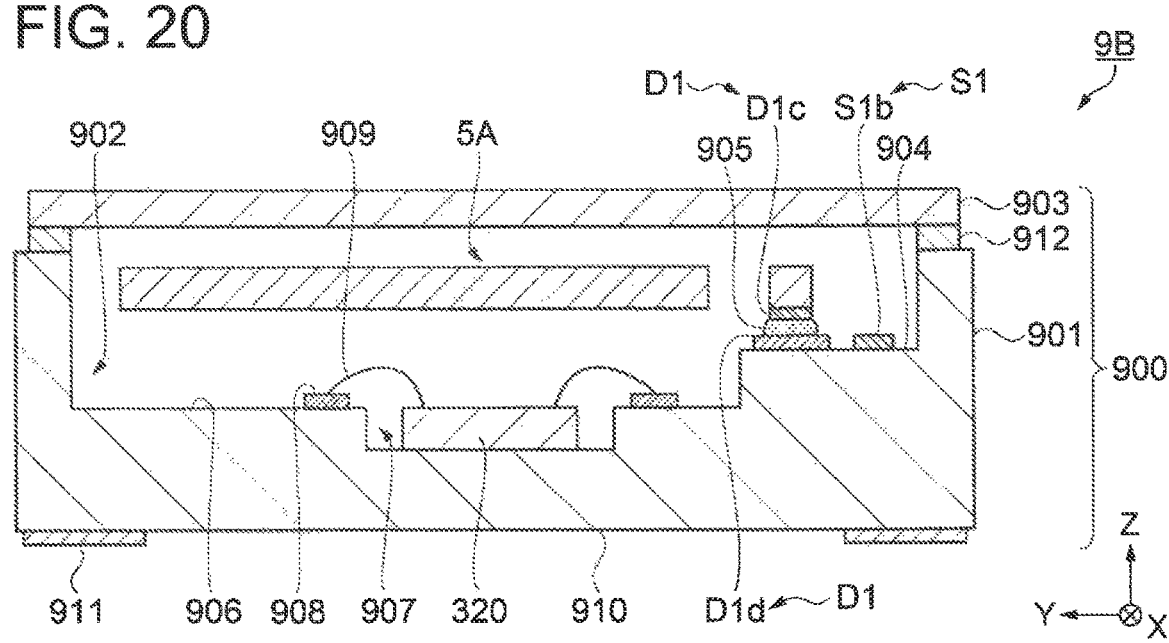
FIG. 20 is a sectional view taken along line H-H in FIG. 19.

FIG. 19 is a plan view showing the configuration of a physical quantity sensor in a fourth embodiment. FIG. 20 is a sectional view taken along line H-H in FIG. 19. Note that, in the fourth embodiment, an H-type gyro vibrating element is used. Therefore, portions common to the third embodiment are denoted by the same reference numerals and signs and detailed explanation of the portions is omitted. Differences from the third embodiment are mainly explained.

As shown in FIGS. 19 and 20, a physical quantity sensor 9B includes a gyro vibrating element 5A functioning as a vibrating element, an IC chip 320 incorporating, for example, the drive circuit 410 that drives the gyro vibrating element 5A and the detection circuit 420 that detects a physical quantity (angular velocity) detecting operation of the gyro vibrating element 5A, and a package 900 functioning as a container that houses the gyro vibrating element 5A and the IC chip 320.

The gyro vibrating element 5A is obtained by removing the adjustment pattern P from the gyro vibrating element 5 in the third embodiment. Note that, in FIG. 19, the configuration of the gyro vibrating element 5A on the second surface 502 side seen through the first surface 501 is shown.

The package 900 includes a package base 901 having a substantially rectangular plane shape and including a recessed section 902 and a flat lid 903 having a substantially rectangular plane shape that covers the recessed section 902 of the package base 901. The package 900 is formed in a substantially rectangular parallelepiped shape.

As the package base 901, a ceramic-based insulative material such as an aluminum oxide sintered body, a mullite sintered body, an aluminum nitride sintered body, a silicon carbide sintered body, or a glass ceramic sintered body sintered by molding and stacking a ceramic green sheet is used.

As the lid 903 that covers the recessed section 902 of the package base 901, a material same as the material of the package base 901 or metal such as Kovar or a 42 alloy is used.

In a step section 904 provided along the inner wall of the recessed section 902 of the package base 901, connection terminals are provided in positions opposed to the signal terminals of the gyro vibrating element 5A. The connection terminals are electrically connected to one another by joining members 905 functioning as connecting sections.

Specifically, a connection terminal D1d is provided in a position opposed to the drive signal terminal D1c. A connection terminal D2d is provided in a position opposed to the drive signal terminal D2c. A connection terminal S1d is provided in a position opposed to the first detection signal terminal S1c. A connection terminal S2d is provided in a position opposed to the second detection signal terminal S2c. The connection terminals are electrically and mechanically connected to one another by the joining members 905.

The connection terminal D1d is included in the drive signal pattern D1. The connection terminal D2d is included in the drive signal pattern D2.

The first detection signal wire S1b extends from the connection terminal S1d included in the first detection signal pattern S1 to the vicinity of the connection terminal D1d along the inner periphery of the recessed section 902. The first detection signal wire S1b includes the adjustment pattern P at the distal end portion.

The second detection signal wire S2b extends from the connection terminal S2d included in the second detection signal pattern S2 to the vicinity of the connection terminal D1d along the inner periphery of the recessed section 902.

Consequently, the drive signal patterns D1 and D2, the first detection signal pattern S1, and the second detection signal pattern S2 are disposed across the gyro vibrating element 5A and the package 900 via the joining members 905. The adjustment pattern P is disposed in the package 900.

A housing recessed section 907 that houses the IC chip 320 is provided in a bottom surface 906 of the recessed section 902 of the package base 901. The IC chip 320 is fixed to the bottom surface of the housing recessed section 907 by an adhesive (not shown in the figure). Connection pads (not shown in the figure) are connected to internal terminals 908 provided around the housing recessed section 907 using bonding wires 909 or the like.

The internal terminals 908 are connected to, for example, the connection terminals and external terminals 911 provided on an outer bottom surface 910 of the package base 901 through internal wires (not shown in the figure).

The signal patterns, the internal terminals 908, the external terminals 911, the internal wires, and the like of the package base 901 are formed of a metal film obtained by stacking, with a plating method or the like, films of nickel, gold, and the like on, for example, a metalized layer formed by printing (applying), using a screen printing method, and thereafter heating, for example, metal paste obtained by mixing an organic binder and a solvent in metal powder of tungsten, molybdenum, or the like.

Note that examples of the joining member 905 include epoxy-based, silicone-based, and polyimide-based conductive adhesives and metal bumps mixed with a conductive substance such as metal powder.

In the physical quantity sensor 9B, in a state in which the gyro vibrating element 5A is connected to the connection terminals of the package base 901, the recessed section 902 of the package base 901 is covered by the lid 903. The package base 901 and the lid 903 are hermetically joined by a joining member 912 such as a seal ring, low-melting point glass, or an adhesive.

The inside of the hermetically joined package 900 is in a decompressed state (a state with a high vacuum degree).

In the physical quantity sensor 9B, angular velocity is detected by the operation of the gyro vibrating element 5A same as the operation in the third embodiment. A detection signal is output from the external terminals 911 through the IC chip 320.

In the physical quantity sensor 9B, the adjustment pattern P is provided in the first detection signal pattern S1 (S1b) of the package 900. A sufficient difference is set between the capacitance C1 of the first detection signal pattern S1 and the capacitance C2 of the second detection signal pattern S2 (S2b) (C1>>C2) anticipating manufacturing variation in advance.

Specifically, the adjustment pattern P is set close to the drive signal pattern D1 (the connection terminal D1d). The adjustment pattern P is formed thicker than the second detection signal pattern S2.

Consequently, in the physical quantity sensor 9B, by adjusting the area of the adjustment pattern P with the method explained in the first embodiment, it is possible to reduce the difference between the capacitance C1 between the first detection signal pattern S1 and the drive signal pattern D1 and the capacitance C2 between the second detection signal pattern S2 and the drive signal pattern D1 and improve detection accuracy of angular velocity.

As explained above, the physical quantity sensor 9B in the fourth embodiment includes a gyro vibrating element 5A and the package 900. The gyro vibrating element 5A and the package 900 are electrically connected to each other by the joining members 905. The adjustment pattern P is disposed in the package 900. Therefore, it is possible to further reduce the size of the gyro vibrating element 5A than when the adjustment pattern P is disposed in the gyro vibrating element 5A.

Note that a double T-type vibrating element may be mounted on the physical quantity sensor 9B instead of the gyro vibrating element 5A. In this case, the same effects can be achieved.

Note that, in the embodiments and the modifications, the material (the base material) of the gyro vibrating element is the piezoelectric body such as quartz crystal. However, the material may be a semiconductor such as silicon.

As the gyro vibrating element, besides the double T type and the H type, it is possible to use various types such as a two-legged tuning fork type, a three-legged tuning fork type, a comb teeth type, an orthogonal type, and a square pyramid type. A plurality of gyro vibrating elements may be mounted on the physical quantity sensor. Consequently, the physical quantity sensor can detect, for example, angular velocities around three axes of the X axis, the Y axis, and the Z axis. In this case, it is also possible to provide the adjustment pattern in only one gyro vibrating element.

Electronic Apparatus

An electronic apparatus including the physical quantity detection device is explained.

Figure 21:
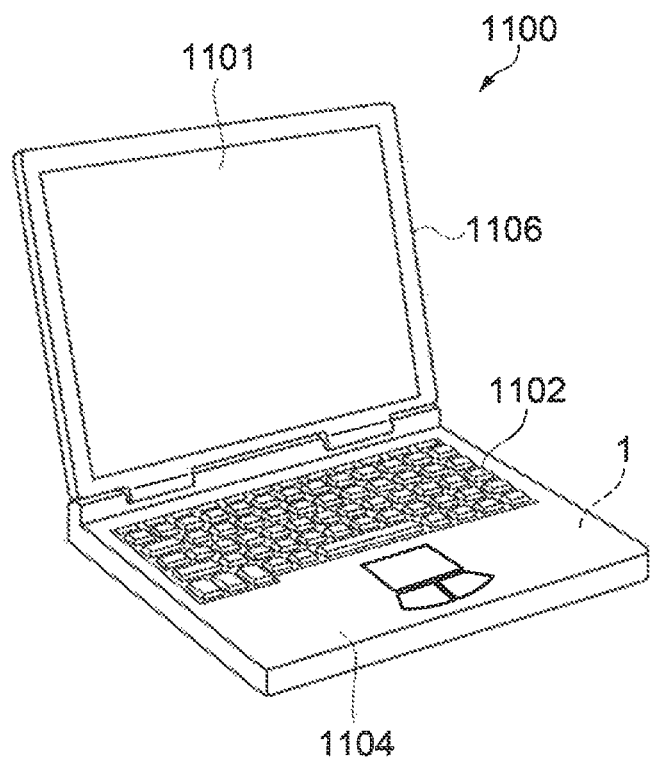
FIG. 21 is a schematic perspective view showing the configuration of a mobile (or notebook) personal computer serving as an electronic apparatus including a physical quantity detection device.

FIG. 21 is a schematic perspective view showing the configuration of a mobile (notebook) personal computer serving as the electronic apparatus including the physical quantity detection device.

As shown in FIG. 21, a personal computer 1100 is configured by a main body section 1104 including a keyboard 1102 and a display unit 1106 including a display section 1101. The display unit 1106 is turnably supported with respect to the main body section 1104 via a hinge structure section.

The personal computer 1100 incorporates any one of the physical quantity detection devices explained above (as an example, the gyro vibrating element 1).

Figure 22:
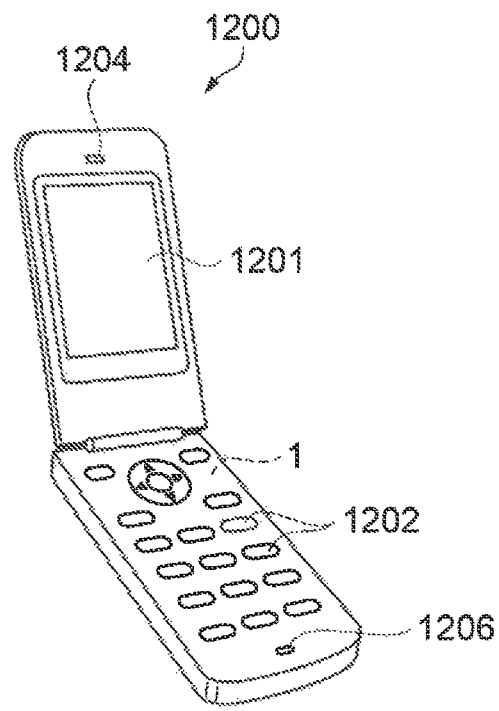
FIG. 22 is a schematic perspective view showing the configuration of a cellular phone (including a PHS) serving as the electronic apparatus including the physical quantity detection device.

FIG. 22 is a schematic perspective view showing the configuration of a cellular phone (including a PHS) serving as the electronic device including the physical quantity detection device.

As shown in FIG. 22, a cellular phone 1200 includes a plurality of operation buttons 1202, an earpiece 1204, and a mouthpiece 1206. A display section 1201 is disposed between the operation buttons 1202 and the earpiece 1204.

The cellular phone 1200 incorporates any one of the physical quantity detection devices explained above (as an example, the gyro vibrating element 1).

Figure 23:
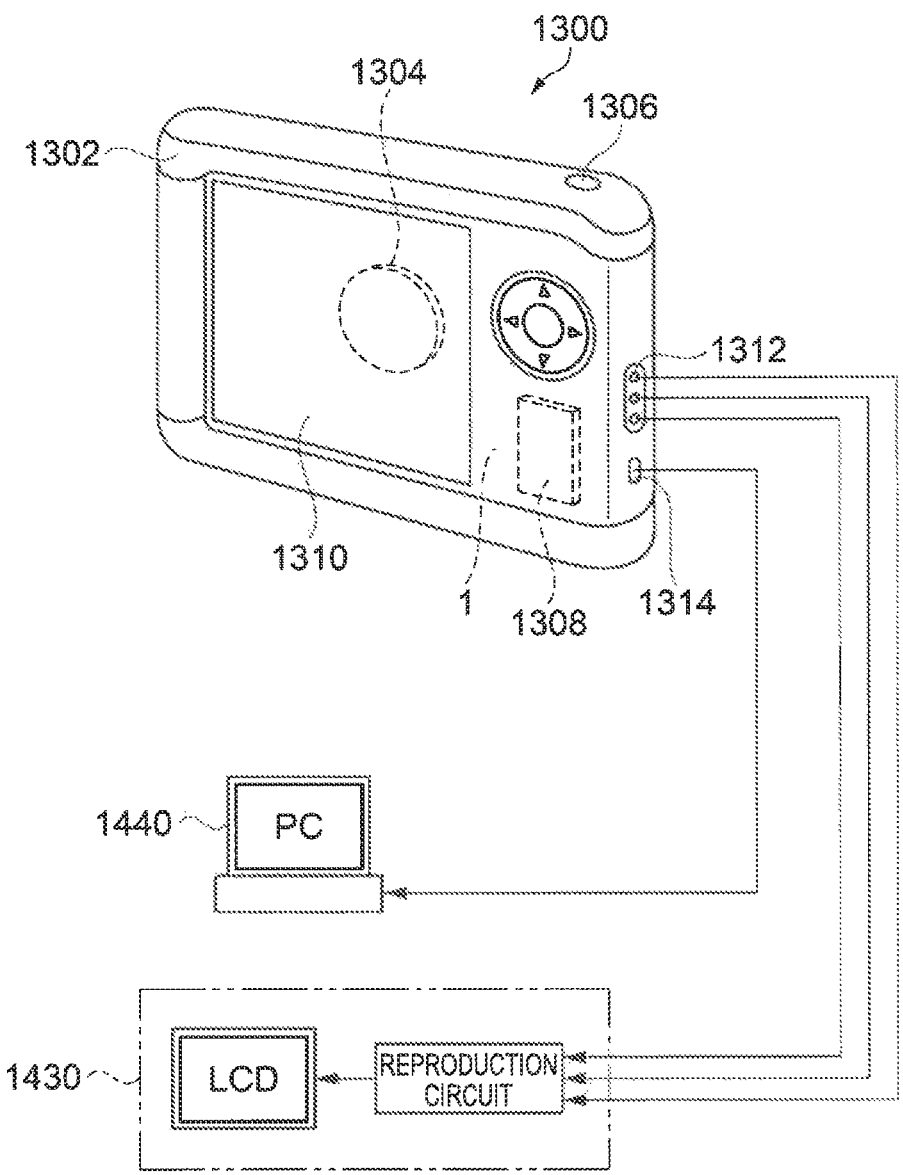
FIG. 23 is a schematic plan view showing the configuration of a digital still camera serving as the electronic apparatus including the physical quantity detection device.

FIG. 23 is a schematic perspective view showing the configuration of a digital still camera serving as the electronic apparatus including the physical quantity detection device. Note that, in FIG. 23, connection to external apparatuses is simply shown.

Whereas a normal camera exposes a silver halide photograph film to an optical image of an object, a digital still camera 1300 photoelectrically converts an optical image of an object with an image pickup device such as a CCD (Chare Coupled Device) and generates an image pickup signal (an image signal).

A display section 1310 is provided on the rear surface (the near side in the figure) of a case (a body) 1302 in the digital still camera 1300. The display section 1310 is configured to perform display on the basis of the image pickup signal generated by the CCD. The display section 1310 functions as a finder that displays an object as an electronic image.

On the front side (the depth side in the figure) of the case 1302, a light receiving unit 1304 including an optical lens (an image pickup optical system) and a CCD is provided.

When a photographer checks an object image displayed on the display section 1310 and depresses a shutter button 1306, an image pickup signal of the CCD at that point is transferred to and stored in a memory 1308.

In the digital still camera 1300, a video signal output terminal 1312 and an input and output terminal 1314 for data communication are provided on a side surface of the case 1302. A television monitor 1430 is connected to the video signal output terminal 1312 according to necessity. A personal computer 1440 is connected to the input and output terminal 1314 for data communication according to necessity. Further, the image pickup signal stored in the memory 1308 is output to the television monitor 1430 and the personal computer 1440 by predetermined operation.

The digital still camera 1300 incorporates any one of the physical quantity detection devices explained above (as an example, the gyro vibrating element 1).

The electronic apparatuses include the physical quantity detection devices. Therefore, the effects explained in the embodiments and the modifications are achieved. It is possible to exhibit excellent performance.

Note that, examples of the electronic device including the physical quantity detection device include, besides the above, an inkjet discharge apparatus (e.g., an inkjet printer), a laptop personal computer, a television, a video camera, a video tape recorder, various navigation apparatuses, a pager, an electronic organizer (including an electronic organizer with a communication function), an electronic dictionary, an electronic calculator, an electronic game machine, a word processor, a work station, a videophone, a television monitor for crime prevention, electronic binoculars, a POS terminal, medical equipment (e.g., an electronic thermometer, a blood pressure manometer, a blood sugar meter, an electrocardiogram measuring apparatus, an ultrasonic diagnostic apparatus, and an electronic endoscope), a fish finder, various measurement instruments, meters, a flight simulator, a GPS module, a network apparatus, and a broadcasting apparatus.

The electronic apparatuses include the physical quantity detection devices. Therefore, the effects explained in the embodiments and the modifications are achieved. It is possible to exhibit excellent performance.

Moving Object

A moving object including the physical quantity detection device is explained.

Figure 24:
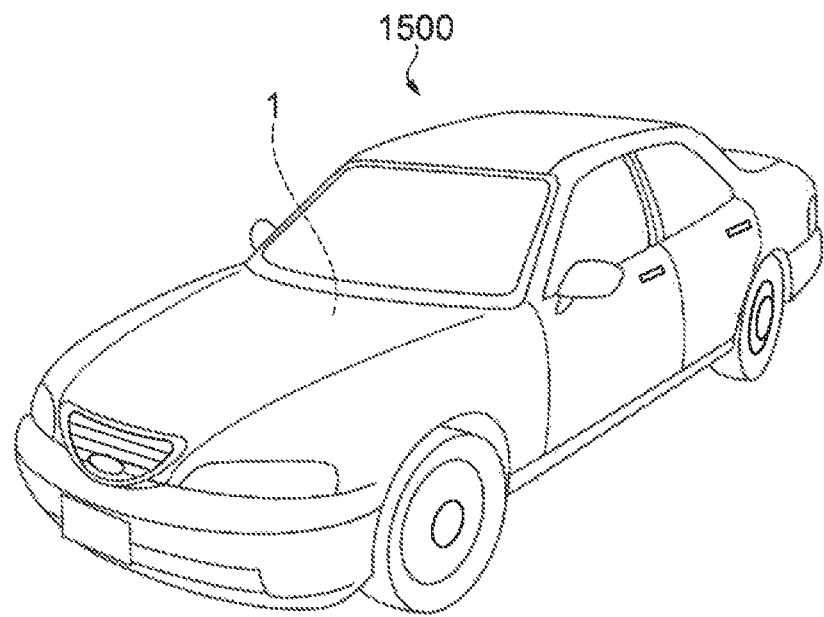
FIG. 24 is a schematic perspective view showing an automobile serving as a moving object including the physical quantity detection device.

FIG. 24 is a perspective view showing the configuration of an automobile serving as a moving object including the physical quantity detection device.

In an automobile 1500 shown in FIG. 24, any one of the physical quantity detection devices explained above (as an example, the gyro vibrating element 1) is used as a component of a posture detection sensor of a navigation apparatus, a posture control apparatus, or the like mounted on the automobile 1500.

The automobile 1500 includes the physical quantity detection device. Therefore, the effects explained in the embodiments and the modifications are achieved. It is possible to exhibit excellent performance.

The physical quantity detection device can be suitably used in a posture detection sensor and the like for not only the automobile 1500 but also moving objects including a self-propelled robot, a self-propelled conveying apparatus, a train, a ship, an airplane, and an artificial satellite. In all the cases, the effects explained in the embodiments and the modifications are achieved. It is possible to exhibit excellent performance.

The entire disclosure of Japanese Patent Application Nos. 2015-166480, filed Aug. 26, 2015 and 2016-117700, filed Jun. 14, 2016 are expressly incorporated by reference herein.

The invention claimed is:

1. A manufacturing method for a physical quantity detection device including:
    a drive signal pattern including a drive electrode to which a drive signal is applied and a drive signal wire connected to the drive electrode;
    a first detection signal pattern including a first detection electrode that outputs a first detection signal and a first detection signal wire connected to the first detection electrode, the first detection signal pattern being capacitively coupled to the drive signal pattern;
    a second detection signal pattern including a second detection electrode that outputs a second detection signal opposite in phase to the first detection signal and a second detection signal wire connected to the second detection electrode, the second detection signal pattern being capacitively coupled to the drive signal pattern; and
    any one of the first detection signal pattern, the second detection signal pattern, and the drive signal pattern including an adjustment pattern for adjustment, the adjustment pattern having a first area,
    the manufacturing method for the physical quantity device comprising:
    reducing, by changing an area of the adjustment pattern to a second area different from the first area, a difference between capacitance due to the capacitive coupling between the first detection signal pattern and the drive signal pattern and capacitance due to the capacitive coupling between the second detection signal pattern and the drive signal pattern, wherein
    the changing of the area of the adjustment pattern includes:
    preparing a physical quantity detection device in which the first detection signal pattern or the second detection signal pattern includes the adjustment pattern and the capacitance of the first or second detection signal pattern including the adjustment pattern is larger than the capacitance of the other,
    removing at least a part of the adjustment pattern with an energy ray, and reducing the area of the adjustment pattern.

2. The manufacturing method for the physical quantity detection device according to claim 1, wherein
    the adjustment pattern includes a first pattern portion having a first width in a direction crossing an extending direction of the adjustment pattern and a second pattern portion having a second width smaller than the first width in the direction,
    the first and second pattern portions abut each other in the extending direction,
    the first pattern portion defines a first distance between one of the first and second detection signal patterns and the drive signal pattern,
    the second pattern portion defines a second distance between the one of the first and second detection signal patterns and the drive signal pattern, and
    the second distance is greater than the first distance.

3. A manufacturing method for a physical quantity detection device including:
    a drive signal pattern including a drive electrode to which a drive signal is applied and a drive signal wire connected to the drive electrode;
    a first detection signal pattern including a first detection electrode that outputs a first detection signal and a first detection signal wire connected to the first detection electrode, the first detection signal pattern being capacitively coupled to the drive signal pattern;
    a second detection signal pattern including a second detection electrode that outputs a second detection signal opposite in phase to the first detection signal and a second detection signal wire connected to the second detection electrode, the second detection signal pattern being capacitively coupled to the drive signal pattern; and
    any one of the first detection signal pattern, the second detection signal pattern, and the drive signal pattern including an adjustment pattern for adjustment, the adjustment pattern having a first area,
    the manufacturing method for the physical quantity device comprising:
    reducing, by changing an area of the adjustment pattern to a second area different from the first area, a difference between capacitance due to the capacitive coupling between the first detection signal pattern and the drive signal pattern and capacitance due to the capacitive coupling between the second detection signal pattern and the drive signal pattern, wherein
    the changing of the area of the adjustment pattern includes:
    preparing a physical quantity detection device in which the first detection signal pattern or the second detection signal pattern includes the adjustment pattern and the capacitance of the detection signal pattern including the adjustment pattern is smaller than the capacitance of the other, and
    increasing the area of the adjustment pattern with at least one of vapor deposition, sputtering, or an ion beam.

* * * * *